(12) United States Patent
Che

(10) Patent No.: US 11,043,640 B2
(45) Date of Patent: Jun. 22, 2021

(54) TUNGSTEN(VI) COMPLEXES FOR OLED APPLICATION

(71) Applicant: THE UNIVERSITY OF HONG KONG, Hong Kong (HK)

(72) Inventor: Chi Ming Che, Hong Kong (HK)

(73) Assignee: THE UNIVERSITY OF HONG KONG, Hong Kong (HK)

( * ) Notice: Subject to any disclaimer, the term of this patent is extended or adjusted under 35 U.S.C. 154(b) by 178 days.

(21) Appl. No.: 16/323,272

(22) PCT Filed: Aug. 11, 2017

(86) PCT No.: PCT/CN2017/096994
§ 371 (c)(1),
(2) Date: Feb. 5, 2019

(87) PCT Pub. No.: WO2018/033024
PCT Pub. Date: Feb. 22, 2018

(65) Prior Publication Data
US 2020/0194690 A1    Jun. 18, 2020

Related U.S. Application Data

(60) Provisional application No. 62/375,961, filed on Aug. 17, 2016.

(51) Int. Cl.
*C07F 11/00*    (2006.01)
*H01L 51/00*    (2006.01)
*C09K 11/06*    (2006.01)
*H01L 51/50*    (2006.01)

(52) U.S. Cl.
CPC ........... *H01L 51/0084* (2013.01); *C07F 11/00* (2013.01); *C09K 11/06* (2013.01); *C09K 2211/183* (2013.01); *H01L 51/001* (2013.01); *H01L 51/0003* (2013.01); *H01L 51/5016* (2013.01)

(58) Field of Classification Search
CPC .......... H01L 51/00; C07F 11/00; C09K 11/06; C09K 2211/183
See application file for complete search history.

(56) References Cited

FOREIGN PATENT DOCUMENTS

WO    2005/057616    6/2005

OTHER PUBLICATIONS

Agarwal, Indian J of Chemistry, vol. 38A, Apr. 1999, 369-372. (Year: 1999).*
Maiti, New J Chem, vol. 30, 479-489, 2006. (Year: 2006).*
International Search Report and Written Opinion for International Patent Application No. PCT/CN2017/096994 dated Nov. 9, 2017, 18 pages.

* cited by examiner

*Primary Examiner* — D Margaret M Seaman
(74) *Attorney, Agent, or Firm* — Amin, Turocy & Watson, LLP

(57) ABSTRACT

Described are to tungsten(VI) emitters. These materials can be used to fabricate OLEDs.

6 Claims, 5 Drawing Sheets

TUNGSTEN(VI) COMPLEXES FOR OLED APPLICATION

TECHNICAL FIELD

Described herein are to tungsten(VI) emitters and their applications in organic light-emitting diodes (OLED).

BACKGROUND

Organic Light-Emitting Diode (OLED) is an innovative technology with numerous practical applications. Due to the high image quality, ultra-thin and fixable, OLED are equipped with high-end consumer electronics products such as smartphones. Nowadays, most of the active-matrix (AM) OLED in the market are using iridium based materials as emitters. As phosphorescent OLED converts all singlet and triplet energy electrical energy to light energy, it is an energy saving technology suitable for lighting. However, it is a big challenge to reduce the cost in transferring this technology to low-end product. One of the costly items in phosphorescent OLED is the phosphorescent emitters. Precious metal such as iridium, gold or platinum is needed to trigger intersystem crossing for obtaining phosphorescence.

Tungsten, being a relatively earth abundant metal, is less costly than iridium and platinum. It is a custom to use tungsten since incandescent light bulb was invented. No negative effect on human or environment has been reported after widely used for more than 100 years. As tungsten is a third-row transition metal with a spin-orbit coupling constant of 2433 $cm^{-1}$ which is comparable to that of iridium and platinum (spin-orbit coupling constant=3909 and 4481 $cm^{-1}$ for Ir and Pt respectively), it should therefore possess strong heavy atom effect that facilitates intersystem crossing and phosphorescence. Furthermore, there is no available d electron in the occupied orbitals of tungsten(VI) ion, the deactivating d-d ligand field excited state often encountered in emissive MLCT excited states is absent and would not contribute to the non-radiative decay, therefore it is important to design tungsten(VI) complexes with high emission energy (e.g. blue emitter) where the problematic d-d excited states are close in energy. However, no strongly emissive tungsten(VI) complex has been reported in the literature.

SUMMARY

Described herein are to novel tungsten(VI) emitters having the chemical structure of Structure I, and their applications in organic light-emitting diode (OLED). In one embodiment, the tungsten(VI)-based compounds of Structure I are shown as follows:

Structure I

wherein W is a tungsten center with an oxidation state of VI. $R_1$ and $R_2$ are coordination units coordinate to the tungsten (VI) center with a nitrogen-tungsten bond and an oxygen-tungsten bond. $R_3$ is a connector connecting $R_1$ and $R_2$ which can contain extra atoms or a single bond only. In some case, $R_3$ can be absent in which $R_1$ and $R_2$ are two independent bidentate ligands. In another embodiment, $R_1$ and $R_2$ are independently aromatic coordination units.

Also provided herein are devices fabricated from the tungsten(VI) emitters of Structure I.

DETAILED DESCRIPTION

Definitions

Figure 1:
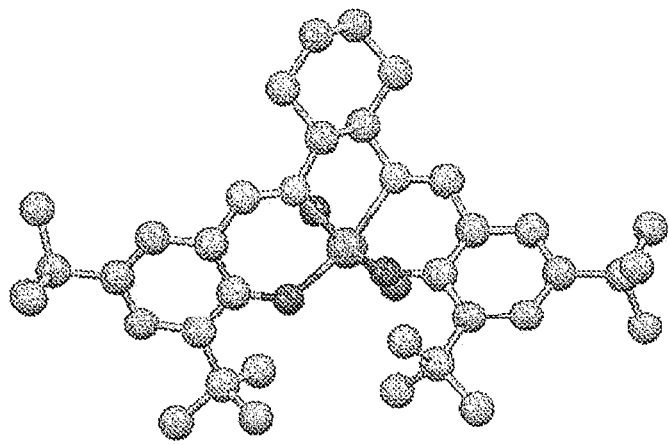
FIG. 1: Perspective view of emitter 1013.
Figure 2:
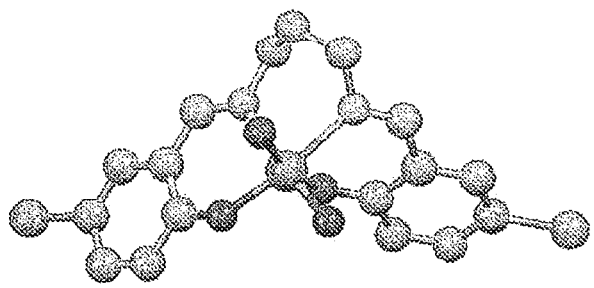
FIG. 2: perspective view of emitter 1017.
Figure 3:
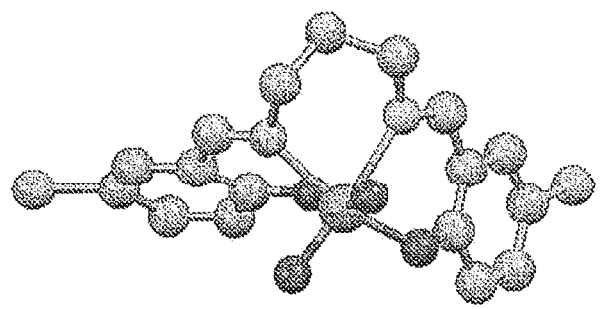
FIG. 3: perspective view of emitter 1018.
Figure 4:
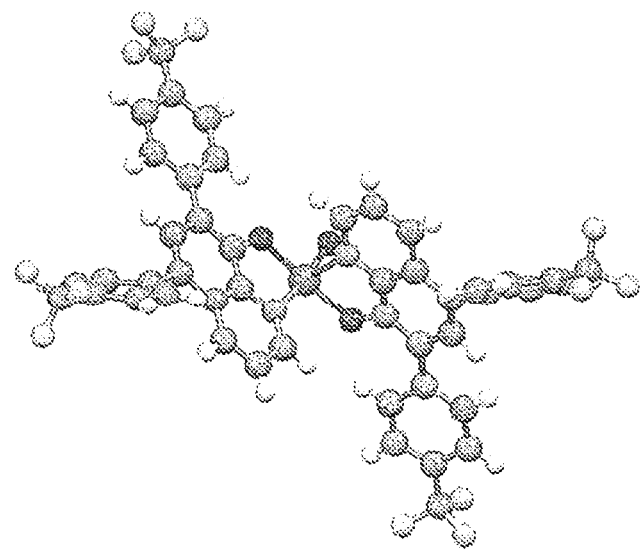
FIG. 4: perspective view of emitter 1027.

To facilitate the understanding of the subject matter disclosed herein, a number of terms, abbreviations or other shorthand as used herein are defined below. Any term, abbreviation or shorthand not defined is understood to have the ordinary meaning used by a skilled artisan contemporaneous with the submission of this application.

"Amino" refers to a primary, secondary, or tertiary amine which may be optionally substituted. Specifically included are secondary or tertiary amine nitrogen atoms which are members of a heterocyclic ring. Also specifically included, for example, are secondary or tertiary amino groups substituted by an acyl moiety. Some non-limiting examples of an amino group include —NR'R" wherein each of R' and R" is independently H, alkyl, aryl, aralkyl, alkaryl, cycloalkyl, acyl, heteroalkyl, heteroaryl or heterocycyl.

"Alkyl" refers to a fully saturated acyclic monovalent radical containing carbon and hydrogen, and which may be branched or a straight chain. Examples of alkyl groups include, but are not limited to, alkyl having 1-20, 1-10 or 1-6 carbon atoms, methyl, ethyl, n-propyl, isopropyl, n-butyl, t-butyl, n-heptyl, n-hexyl, n-octyl, and n-decyl.

"Alkylamino" means a radical —NHR or —$NR_2$ where each R is independently an alkyl group. Representative examples of alkylamino groups include, but are not limited to, methylamino, (1-methylethyl)amino, methylamino, dimethylamino, methylethylamino, and di(1-methyethyl)amino. The term "hydroxyalkyl" means an alkyl radical as defined herein, substituted with one or more, preferably one, two or three hydroxy groups. Representative examples of hydroxyalkyl include, but are not limited to, hydroxymethyl, 2-hydroxyethyl, 2-hydroxypropyl, 3-hydroxypropyl, 1-(hydroxymethyl)-2-methylpropyl, 2-hydroxybutyl, 3-hydroxybutyl, 4-hydroxybutyl, 2,3-dihydroxypropyl, 2-hydroxy-1-hydroxymethylethyl, 2,3-dihydroxybutyl, 3,4-dihydroxybutyl and 2-(hydroxymethyl)-3-hydroxy-propyl, preferably 2-hydroxyethyl, 2,3-dihydroxypropyl, and 1-(hydroxymethyl)2-hydroxyethyl.

The term "alkoxy," as used herein, refers the radical —$OR_x$, where $R_x$ is alkyl. Exemplary alkoxy groups include, but are not limited to, methoxy, ethoxy, and propoxy.

"Aromatic" or "aromatic group" refers to aryl or heteroaryl.

"Aryl" refers to optionally substituted carbocyclic aromatic groups (e.g., having 6-20 carbon atoms). In some embodiments, the aryl group includes phenyl, biphenyl, naphthyl, substituted phenyl, substituted biphenyl or substituted naphthyl. In other embodiments, the aryl group is phenyl or substituted phenyl.

"Aralkyl" refers to an alkyl group which is substituted with an aryl group. Some non-limiting examples of aralkyl include benzyl and phenethyl.

"Acyl" refers to a monovalent group of the formula —C(=O)H, —C(=O)-alkyl, —C(=O)-aryl, —C(=O)-aralkyl, or —C(=O)-alkaryl.

"Halogen" refers to fluorine, chlorine, bromine and iodine.

"Styryl" refers to a univalent radical $C_6H_5$—CH=CH— derived from styrene.

"Substituted" as used herein to describe a compound or chemical moiety refers to that at least one hydrogen atom of that compound or chemical moiety is replaced with a second chemical moiety. Non-limiting examples of substituents are those found in the exemplary compounds and embodiments disclosed herein, as well as halogen; alkyl; heteroalkyl; alkenyl; alkynyl; aryl; heteroaryl; hydroxy; alkoxyl; amino; nitro; thiol; thioether; imine; cyano; amido; phosphonato; phosphine; carboxyl; thiocarbonyl; sulfonyl; sulfonamide; ketone; aldehyde; ester; oxo; haloalkyl (e.g., trifluoromethyl); carbocyclic cycloalkyl, which can be monocyclic or fused or non-fused polycyclic (e.g., cyclopropyl, cyclobutyl, cyclopentyl or cyclohexyl) or a heterocycloalkyl, which can be monocyclic or fused or non-fused polycyclic (e.g., pyrrolidinyl, piperidinyl, piperazinyl, morpholinyl or thiazinyl); carbocyclic or heterocyclic, monocyclic or fused or non-fused polycyclic aryl (e.g., phenyl, naphthyl, pyrrolyl, indolyl, furanyl, thiophenyl, imidazolyl, oxazolyl, isoxazolyl, thiazolyl, triazolyl, tetrazolyl, pyrazolyl, pyridinyl, quinolinyl, isoquinolinyl, acridinyl, pyrazinyl, pyridazinyl, pyrimidinyl, benzimidazolyl, benzothiophenyl or benzofuranyl); amino (primary, secondary or tertiary); o-lower alkyl; o-aryl, aryl; aryl-lower alkyl; —$CO_2CH_3$; —$CONH_2$; —$OCH_2CONH_2$; —$NH_2$; —$SO_2NH_2$; —$OCHF_2$; —$CF_3$; —$OCF_3$; —NH(alkyl); —N(alkyl)$_2$; —NH(aryl); —N(alkyl)(aryl); —N(aryl)$_2$; —CHO; —CO(alkyl); —CO(aryl); —$CO_2$(alkyl); and —$CO_2$(aryl); and such moieties can also be optionally substituted by a fused-ring structure or bridge, for example —$OCH_2O$—. These substituents can optionally be further substituted with a substituent selected from such groups. All chemical groups disclosed herein can be substituted, unless it is specified otherwise. For example, "substituted" alkyl, alkenyl, alkynyl, aryl, hydrocarbyl or heterocyclo moieties described herein are moieties which are substituted with a hydrocarbyl moiety, a substituted hydrocarbyl moiety, a heteroatom, or a heterocyclo. Further, substituents may include moieties in which a carbon atom is substituted with a heteroatom such as nitrogen, oxygen, silicon, phosphorus, boron, sulfur, or a halogen atom. These substituents may include halogen, heterocyclo, alkoxy, alkenoxy, alkynoxy, aryloxy, hydroxy, protected hydroxy, keto, acyl, acyloxy, nitro, amino, amido, cyano, thiol, ketals, acetals, esters and ethers.

In one aspect, the "connector" comprises divalent linking groups. The divalent linking groups include, but are not limited to an —O—, —S—, alkylene (e.g., having 1 to 6 carbon atoms), cycloalkylene (e.g., having 3 to 12 carbon atoms), alkenylene (e.g., having 2 to 8 carbon atoms), arylene, sulfonyl, carbonyl, —CH(OH)—, —C(=O)O—, —O—C(=O)—, or heterocyclene group, or a combination of two or more of such groups. Each of these groups can be substituted with one or more substituents. More specific examples include methylene, ethylene, propylene, cyclopropylene, cyclobutylene, cyclopentylene, cyclohexylene, —$CH_2CH(OH)CH_2$—O—$CH_2$— groups, all of which can be further substituted.

In one aspect, the present invention provides tungsten(VI) emitters. In one embodiment, an organometallic emitter represented by Structure I is provided. The tungsten center in Structure I is in +6 oxidation state and has a octahedral geometry. The coordination sites of the tungsten center are occupied by a tetradentate ligand or two bidentate ligands and two oxygen atoms.

Tungsten(VI) Emitters

In one embodiment, the tungsten(VI) emitters have the chemical structures of Structure II:

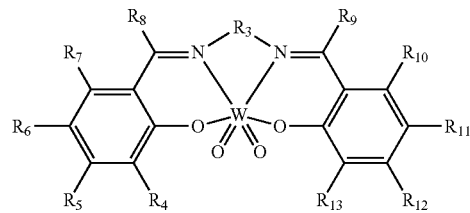

Structure II wherein $R_4$-$R_{13}$ are independently hydrogen, halogen, hydroxyl, an unsubstituted alkyl, a substituted alkyl, cycloalkyl, an unsubstituted aryl, a substituted aryl, acyl, alkoxy, acyloxy, amino, nitro, acylamino, aralkyl, cyano, carboxyl, thio, styryl, aminocarbonyl, carbamoyl, aryloxycarbonyl, phenoxycarbonyl, or an alkoxycarbonyl group. Each pair of adjacent R groups of $R_4$-$R_{13}$ can independently form 5-8 member ring(s) with 2 or 4 carbon atoms in the phenyl ring(s) showed in Structure II.

In another embodiment, the tungsten(VI) emitters have the chemical structures of Structure III:

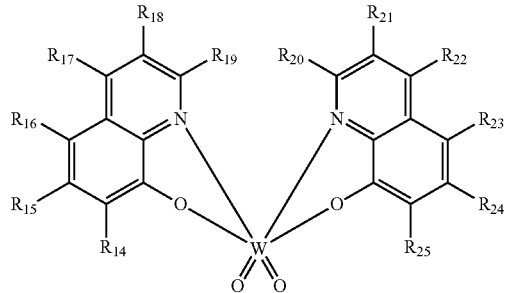

Structure III wherein $R_{14}$-$R_{25}$ are independently hydrogen, halogen, hydroxyl, an unsubstituted alkyl, a substituted alkyl, cycloalkyl, an unsubstituted aryl, a substituted aryl, acyl, alkoxy, acyloxy, amino, nitro, acylamino, aralkyl, cyano, carboxyl, thio, styryl, aminocarbonyl, carbamoyl, aryloxycarbonyl, phenoxycarbonyl, or an alkoxycarbonyl group. Each pair of adjacent R groups of $R_{14}$-$R_{25}$ can independently form 5-8 member ring(s) with 2 or 4 carbon atoms in the phenyl ring(s) showed in Structure III. In one embodiment, $R_4$-$R_{25}$ is independently hydrogen, halogen, hydroxyl, an unsubstituted alkyl containing from 1 to 10 carbon atoms, a substituted alkyl containing from 1 to 20 carbon atoms, cycloalkyl containing from 4 to 20 carbon atoms, an unsubstituted aryl containing from 6 to 20 carbon atoms, a substituted aryl containing from 6 to 20 carbon atoms, acyl containing from 1 to 20 carbon atoms, alkoxy containing from 1 to 20 carbon atoms, acyloxy containing from 1 to 20 carbon atoms, amino, nitro, acylamino containing from 1 to 20 carbon atoms, aralkyl containing from 1 to 20 carbon atoms, cyano, carboxyl containing from 1 to 20 carbon atoms, thiol, styryl, aminocarbonyl containing from 1 to 20 carbon atoms, carbamoyl containing from 1 to 20 carbon atoms, aryloxycarbonyl containing from 1 to 20 carbon atoms, phenoxycarbonyl containing from 1 to 20 carbon atoms, or an alkoxycarbonyl group containing from 1 to 20 carbon atoms.

Certain specific, non-limiting examples for the tungsten (VI) emitters in accordance with Structure I are shown as follows:

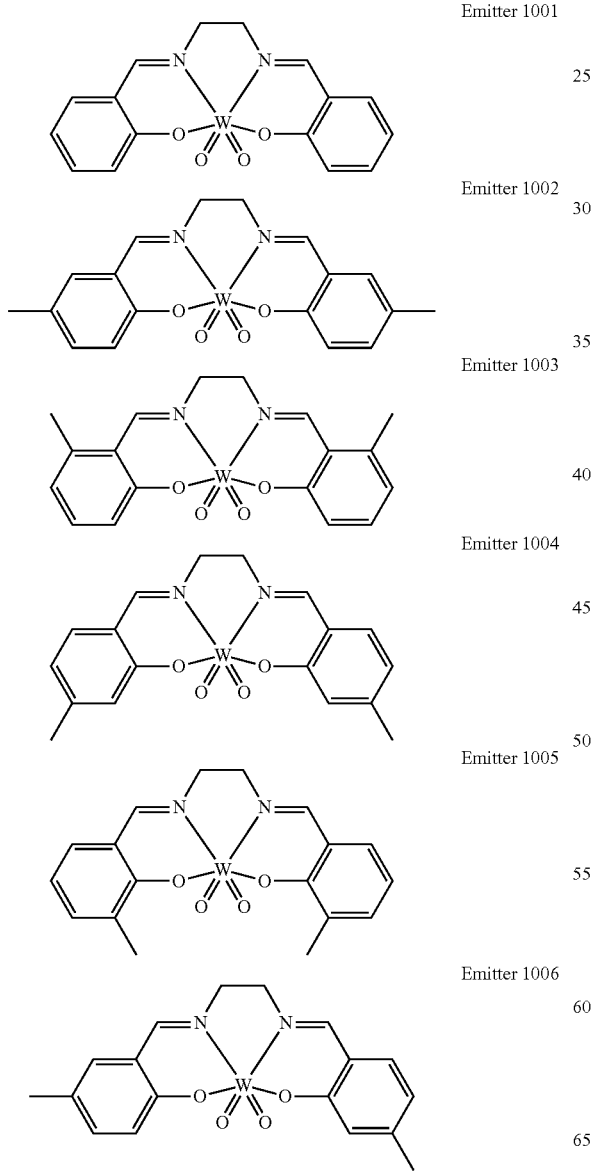

Emitter 1001

Emitter 1002

Emitter 1003

Emitter 1004

Emitter 1005

Emitter 1006

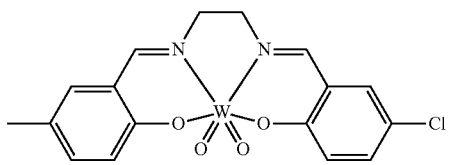

Emitter 1007

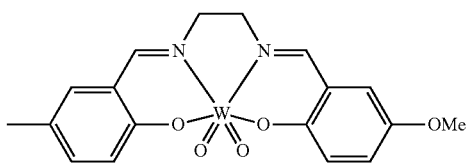

Emitter 1008

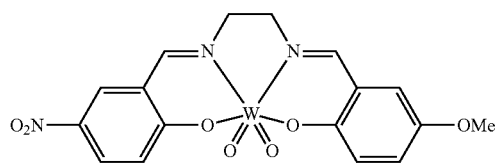

Emitter 1009

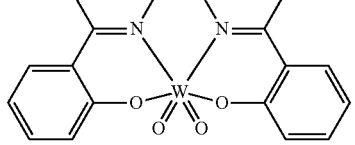

Emitter 1010

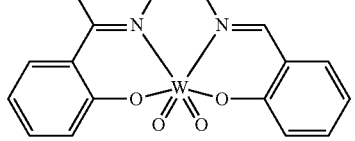

Emitter 1011

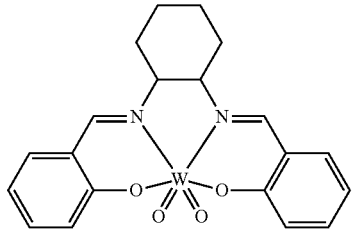

Emitter 1012

Emitter 1013

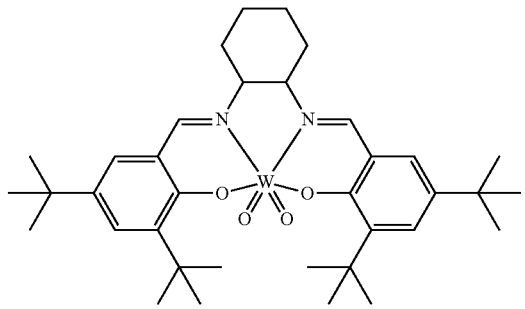

Emitter 1014
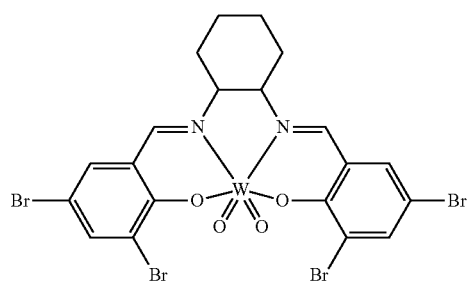
Emitter 1015
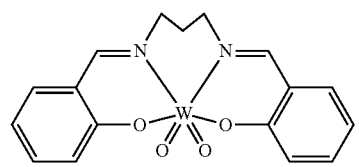
Emitter 1016
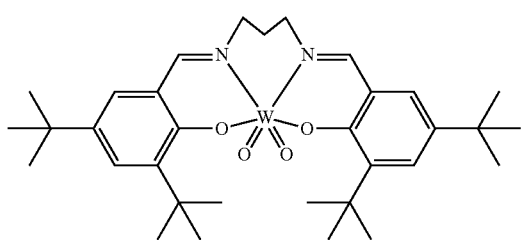
Emitter 1017
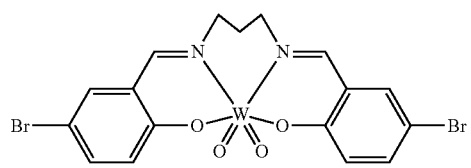
Emitter 1018
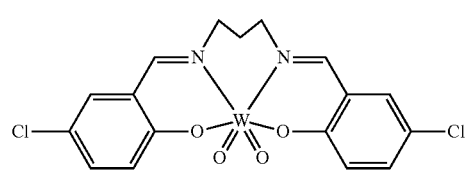
Emitter 1019
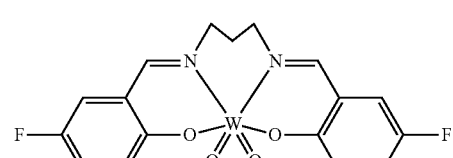
Emitter 1020
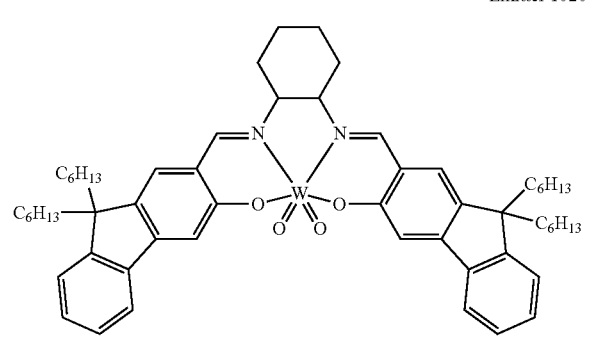
Emitter 1021
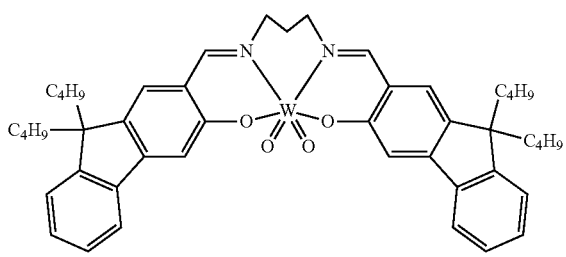
Emitter 1022
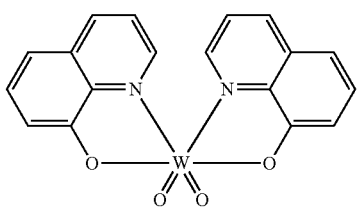
Emitter 1023
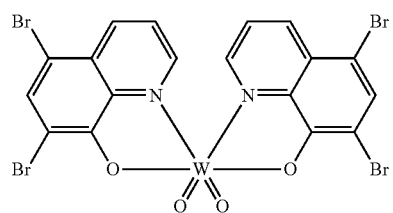
Emitter 1024
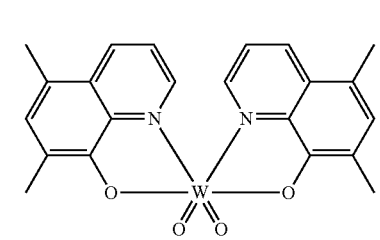
Emitter 1025
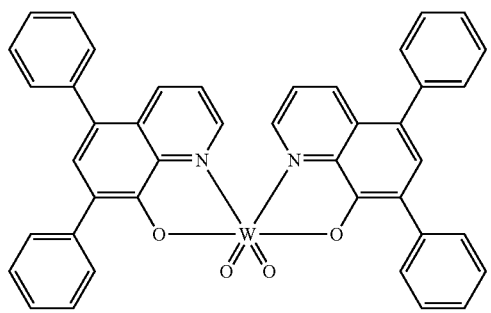

Emitter 1026
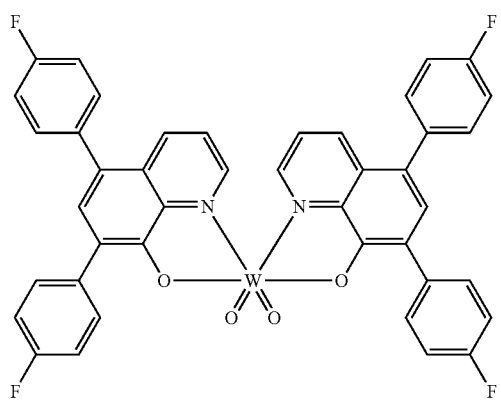
Emitter 1027
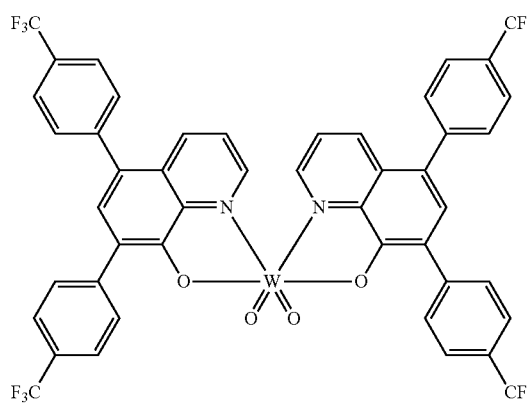
Emitter 1028
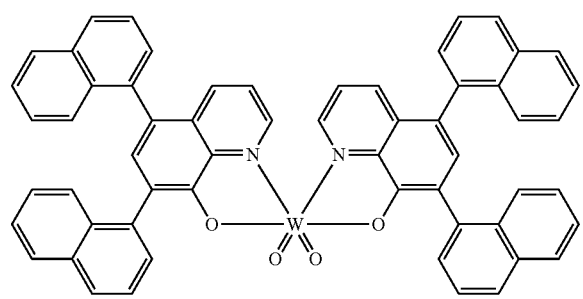
Additonal non-limiting examples for the tungsten(VI) emitters in accordance with Structure I are shown as follows:
1029
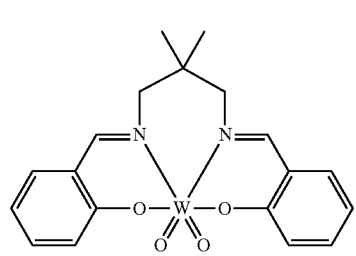
1030
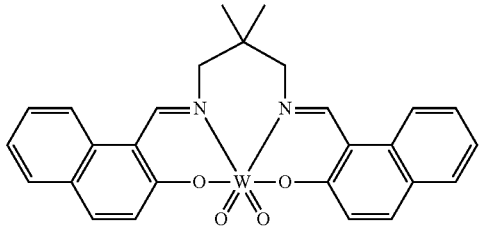
1031
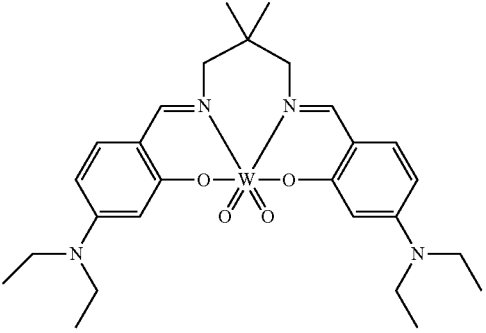
1032
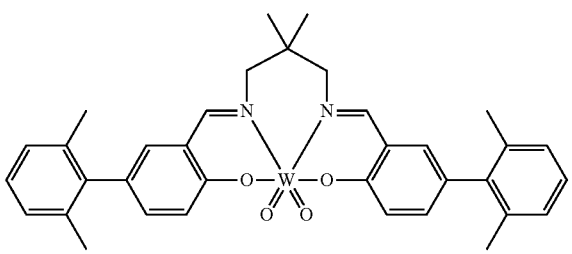
1033
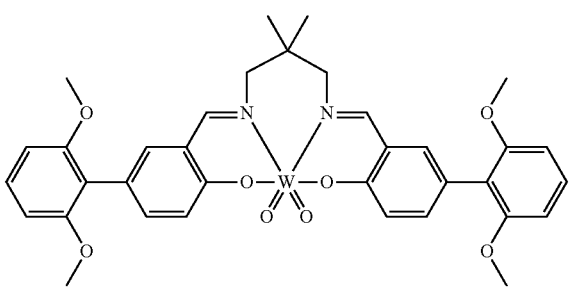
1034
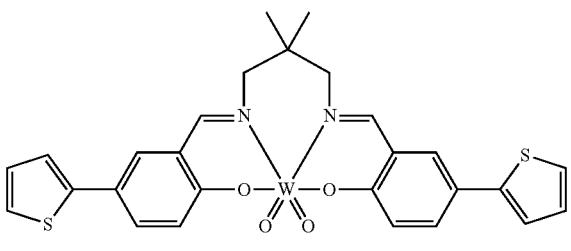

-continued

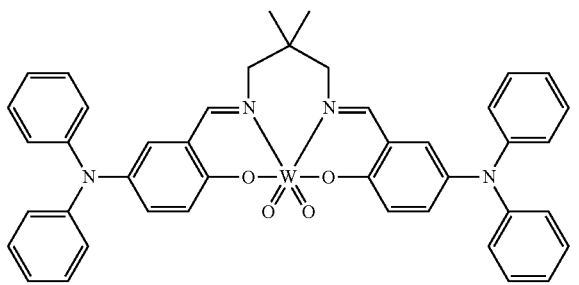

1035

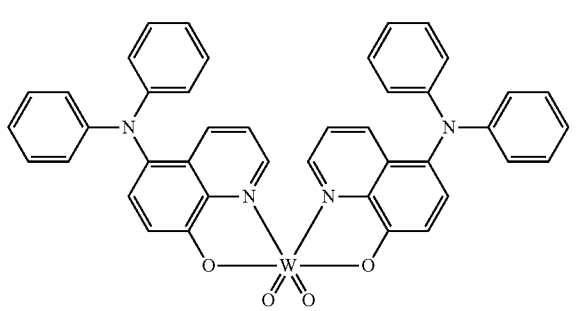

1036

Preparation of Tungsten(VI) Emitter

In one embodiment, the tungsten(VI) emitter with chemical structure of

Structure I can be prepared by reacting the corresponding ligand with a tungsten salt in the presence of suitable solvent(s) and under suitable conditions.

EXAMPLES

Following are examples that illustrate embodiments for practicing the invention. These examples should not be construed as limiting. All percentages are by weight and all solvent mixture proportions are by volume unless otherwise noted.

Example 201-Emitter 1012

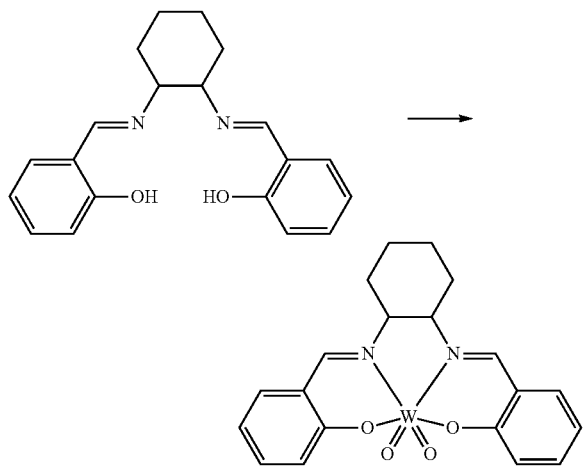

To a degassed solution of the ligand (56 mg, 0.17 mmol) in dry toluene were added $WO_2Cl_2$ (50 mg, 0.17 mmol) and pyridine (0.029 ml, 0.37 mmol). The reaction mixture was refluxed for 24 h under $N_2$ atmosphere. The reaction mixture was filtered through celite and the filtrate was collected. The solvent was then removed under reduced pressure and the yellow residue was dissolved in dichloromethane (10 ml). The addition of diethyl ether (30 ml) to the dichloromethane solution led to the precipitation of a yellow solid which was washed with diethyl ether (5×10 ml). The yellow solid was filtered and dried under vacuum. Yield: 31%. $^1$H NMR (500 MHz, CDCl$_3$) δ=8.41 (s, 1H), 8.36 (d, J=1.9, 1H), 7.64-7.57 (m, 1H), 7.50 (ddd, J=8.7, 7.0, 1.8, 1H), 7.44 (d, J=7.8, 2H), 7.20 (d, J=8.3, 1H), 7.09-7.03 (m, 1H), 6.98 (d, J=8.5, 1H), 6.80 (t, J=7.5, 1H), 4.55 (t, J=11.0, 1H), 2.89 (t, J=10.5, 1H), 2.56 (d, J=15.4, 1H), 2.42 (d, J=10.0, 1H), 2.09 (d, J=14.5, 2H), 1.84-1.65 (m, 2H), 1.48-1.35 (m, 2H). $^{13}$C NMR (151 MHz, CD$_2$Cl$_2$) δ=168.11, 163.72, 162.26, 158.90, 138.54, 136.28, 135.44, 133.51, 124.87, 122.18, 122.10, 121.41, 120.92, 118.55, 74.55, 72.06, 30.70, 29.24, 25.11, 24.35. IR (KBr disk, v/cm$^{-1}$): 935 (m, W=O), 892 (m, W=O). FAB-MS (+ve, m/z): 537.5 [M$^+$]. Anal. Calcd. For $C_{20}H_{20}N_2O_4W$: C, 44.80; H, 3.76; N, 5.22. Found: C, 44.71; H, 4.15; N, 5.26.

Example 202-Synthesis of Emitter 1013

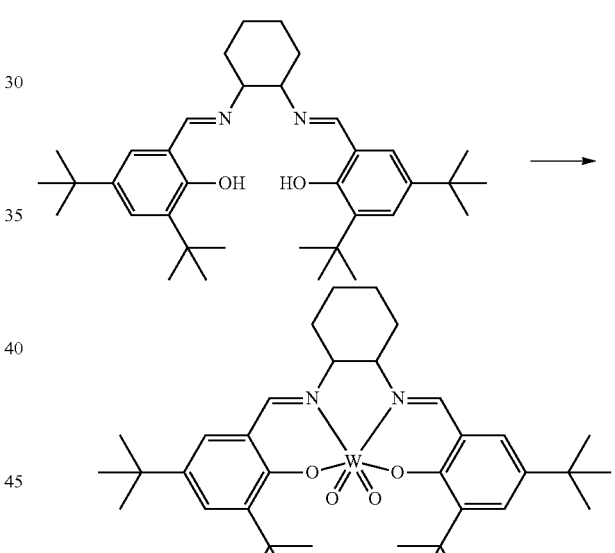

To a degassed solution of the ligand (0.19 g, 0.35 mmol) in dry toluene were added $WO_2Cl_2$ and pyridine. The reaction mixture was refluxed for 24 h under $N_2$ atmosphere. The reaction mixture was filtered through celite and the filtrate was collected. The solvent was then removed under reduced pressure and the yellow residue was dissolved in dichloromethane. The addition of diethyl ether to the dichloromethane solution led to the precipitation of a yellow solid which was washed with diethyl ether. The yellow solid was filtered and dried under vacuum. Yield: 42%. $^1$H NMR (500 MHz, CDCl$_3$) δ=8.43-8.39 (m, 1H), 8.36 (d, J=2.0, 1H), 7.73 (d, J=2.5, 1H), 7.60 (d, J=2.6, 1H), 7.34 (d, J=2.5, 1H), 7.30 (d, J=2.5, 1H), 4.49 (dd, J=10.7, 2.7, 1H), 2.84 (t, J=9.7, 1H), 2.52 (dd, J=12.1, 3.1, 1H), 2.40 (d, J=11.6, 1H), 2.06 (s, 2H), 1.80-1.66 (m, 2H), 1.66-1.54 (m, 2H), 1.48 (s, 9H), 1.36 (s, 9H), 1.32 (s, 9H), 1.27 (s, 9H). $^{13}$C NMR (126 MHz, CDCl$_3$) δ=165.01, 163.10, 162.63, 155.90, 143.48, 140.54, 139.64, 139.38, 132.64, 130.68, 129.49, 126.29, 123.78, 121.63, 73.31, 71.60, 53.61, 53.39, 53.18, 52.96, 35.33, 34.25, 33.98, 31.09, 30.89, 30.33, 29.84, 29.38, 28.57, 24.63, 23.87, 22.31. IR (KBr disk, v/cm$^{-1}$): 939 (m, W=O), 894 (m, W=O). FAB-MS (+ve, m/z): 762.0 [M$^+$]. Anal. Calcd. For $C_{36}H_{52}N_2O_4W$: C, 44.80; H, 3.76; N, 5.22. Found: C, 44.71; H, 4.15; N, 5.26.

Example 203-Synthesis of Emitter 1014

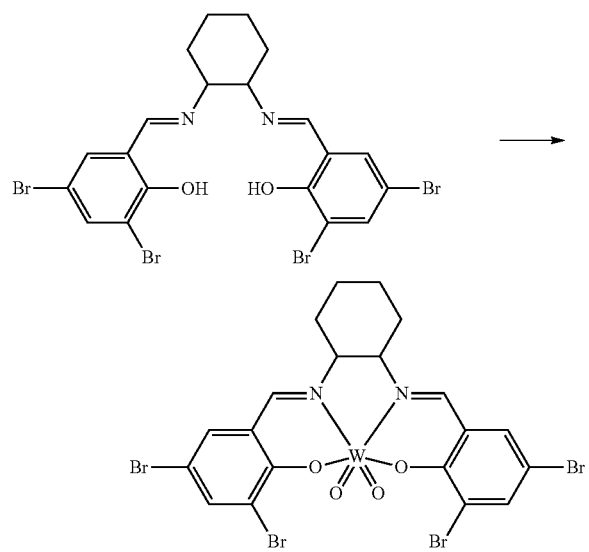

To a degassed solution of the ligand (0.44 g, 0.70 mmol) in dry toluene were added $WO_2Cl_2$ and pyridine. The reaction mixture was refluxed for 24 h under $N_2$ atmosphere. The reaction mixture was filtered through celite and the filtrate was collected. The solvent was then removed under reduced pressure and the yellow residue was dissolved in dichloromethane. The addition of diethyl ether to the dichloromethane solution led to the precipitation of a yellow solid which was washed with diethyl ether. The yellow solid was filtered and dried under vacuum. Yield: 12%. $^1$H NMR (500 MHz, CDCl$_3$) δ=8.39 (s, 1H), 8.33 (d, J=0.7, 1H), 8.05 (d, J=1.8, 1H), 7.91 (d, J=2.8, 1H), 7.63 (d, J=1.8, 2H), 4.68-4.52 (m, 1H), 3.06-2.92 (m, 1H), 2.54 (d, J=14.8, 1H), 2.42 (d, J=10.5, 1H), 2.10 (dd, J=14.3, 2.5, 1H), 1.72 (m, 3H), 1.47 (s, 2H). IR (KBr disk, v/cm$^{-1}$): 939 (m, W=O), 899 (m, W=O). FAB-MS (+ve, m/z): 852.7 [M$^{30}$]. Anal. Calcd. For $C_{20}H_{16}Br_4N_2O_4W$: C, 28.20; H, 1.89; N, 3.29. Found: C, 28.38; H, 1.99; N, 3.31.

Example 204-Synthesis of Emitter 1015

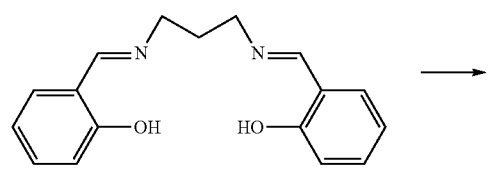

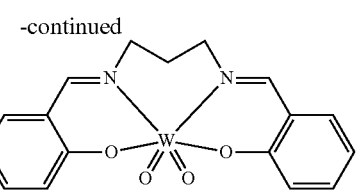

To a degassed solution of the ligand in dry toluene were added $WO_2Cl_2$ and pyridine. The reaction mixture was refluxed for 24 h under $N_2$ atmosphere. The reaction mixture was filtered through celite and the filtrate was collected. The solvent was then removed under reduced pressure and the yellow residue was dissolved in dichloromethane. The addition of diethyl ether to the dichloromethane solution led to the precipitation of a yellow solid which was washed with diethyl ether. The yellow solid was filtered and dried under vacuum. Yield: 57%. $^1$H NMR (500 MHz, CDCl3) δ=8.33 (s, 1H), 8.14 (s, 1H), 7.55 (td, J=7.0, 1.7 Hz, 1H), 7.43 (td, J=6.9, 1.7 Hz, 1H), 7.37 (dd, J=7.7, 1.6 Hz, 1H), 7.31 (dd, J=8.2, 1.6 Hz, 1H), 7.11 (d, J=8.3 Hz, 1H), 7.02 (td, J=7.6, 0.8 Hz, 1H), 6.74 (m, 2H), 5.01 (m, 1H), 4.19 (m, 2H), 3.84 (m, 1H), 2.54 (m, 1H), 2.05 (m, 1H). $^{13}$C NMR (151 MHz, CDCl$_3$) δ=169.15, 167.79, 162.99, 159.88, 138.16, 135.20, 133.53, 133.29, 122.55, 122.31, 121.20, 121.16, 120.56, 118.24, 64.69, 59.88, 30.66. FAB-MS (+ve, m/z): 496.9 [MH$^+$]. Anal. Calcd. For $C_{17}H_{16}N_2O_4W$•0.25 $CH_2Cl_2$: C, 40.04; H, 3.21; N, 5.41. Found: C, 40.11; H, 3.35; N, 5.52.

Example 205-Synthesis of Emitter 1016

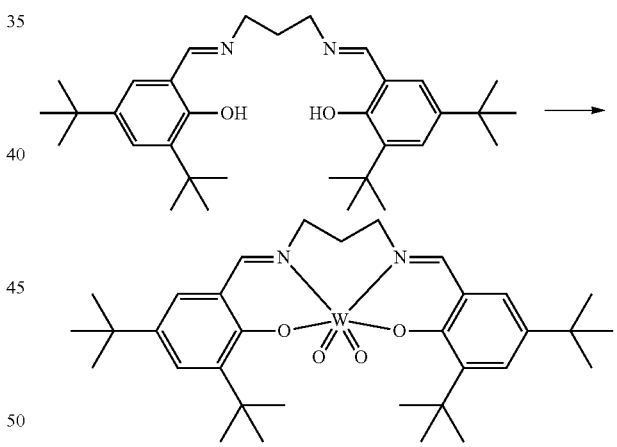

To a degassed solution of the ligand in dry toluene were added $WO_2Cl_{12}$ and pyridine. The reaction mixture was refluxed for 24 h under $N_2$ atmosphere. The reaction mixture was filtered through celite and the filtrate was collected. The solvent was then removed under reduced pressure and the yellow residue was dissolved in dichloromethane. The addition of diethyl ether to the dichloromethane solution led to the precipitation of a yellow solid which was washed with diethyl ether. The yellow solid was filtered and dried under vacuum. Yield: 82%. $^1$H NMR (500 MHz, CDCl$_3$) δ 8.30 (s, 1H), 8.09 (s, 1H), 7.62 (d, J=2.4 Hz, 1H), 7.50 (d, J=2.4 Hz, 1H), 7.19 (d, J=2.4 Hz, 1H), 7.10 (d, J=2.4 Hz, 1H), 5.03 (m, 1H), 4.13 (m, 2H), 3.79 (m, 1H), 2.50 (m, 1H), 1.99 (m, 1H), 1.44 (s, 9H), 1.32 (s, 9H), 1.26 (s, 9H), 1.05 (s, 9H). $^{13}$C NMR (151 MHz, CDCl$_3$) δ=169.06, 165.28, 163.47, 156.46, 142.93, 140.23, 139.88, 139.49, 133.10, 130.25, 128.09, 126.83, 122.54, 122.01, 64.22, 59.77, 35.41, 34.77, 34.30, 34.00, 31.43, 31.14, 31.01, 30.01, 29.51. FAB-MS (+ye, m/z): 721.0 [MH$^+$]. Anal. Calcd. For $C_{33}H_{48}N_2O_4W\cdot0.5CH_2Cl_2$: C, 52.73; H, 6.47; N, 3.67. Found: C, 52.20; H, 6.50; N, 3.57.

Example 206-Synthesis of Emitter 1017

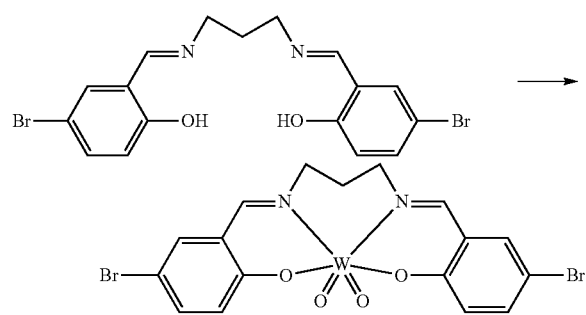

To a degassed solution of the ligand in dry toluene were added $WO_2Cl_2$ and pyridine. The reaction mixture was refluxed for 24 h under $N_2$ atmosphere. The reaction mixture was filtered through celite and the filtrate was collected. The solvent was then removed under reduced pressure and the yellow residue was dissolved in dichloromethane. The addition of diethyl ether to the dichloromethane solution led to the precipitation of a yellow solid which was washed with diethyl ether. The yellow solid was filtered and dried under vacuum. Yield: 45%. $^1$H NMR (500 MHz, CDCl$_3$) δ 8.27 (s, 1H), 8.06 (s, 1H), 7.63 (dd, J=8.8, 2.5 Hz, 1H), 7.49 (d, J=2.5 Hz, 1H), 7.47 (dd, J=8.8, 2.5 Hz, 1H), 7.42 (d, J=2.5 Hz, 1H), 7.01 (d, J=8.8 Hz, 1H), 6.61 (d, J=9.0 Hz, 1H), 4.98 (m, 1H), 4.32 (t, J=10.5 Hz, 1H), 4.21 (m, 1H), 3.83 (m, 1H), 2.53 (m, 1H), 2.03 (m, 1H). $^{13}$C NMR (151 MHz, CDCl$_3$) δ=168.16, 166.75, 161.96, 158.85, 140.78, 137.85, 135.39, 134.62, 124.07, 123.53, 123.16, 122.52, 112.91, 109.59, 65.35, 60.30, 31.12. FAB-MS (+ve, m/z): 654.5 [MH$^+$]. Anal. Calcd. For $C_{12}H_{14}Br_2N_2O_4W\cdot0.5CH_2Cl_2$: C, 30.18; H, 2.17; N, 4.02. Found: C, 30.13; H, 2.33; N, 4.03.

Example 207-Synthesis of Emitter 1018

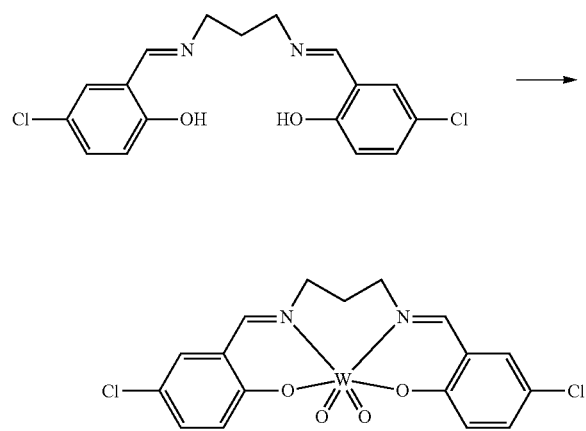

To a degassed solution of the ligand in dry toluene were added $WO_2Cl_2$ and pyridine. The reaction mixture was refluxed for 24 h under $N_2$ atmosphere. The reaction mixture was filtered through celite and the filtrate was collected. The solvent was then removed under reduced pressure and the yellow residue was dissolved in dichloromethane. The addition of diethyl ether to the dichloromethane solution led to the precipitation of a yellow solid which was washed with diethyl ether. The yellow solid was filtered and dried under vacuum. Yield: 47%. $^1$H NMR (500 MHz, CDCl$_3$) δ 8.27 (s, 1H), 8.06 (s, 1H), 7.49 (dd, J=8.8, 2.6 Hz, 1H), 7.35 (dd, J=9.5, 2.5 Hz, 1H), 7.34 (d, J=2.5 Hz, 1H), 7.27 (m, 1H), 7.06 (d, J=8.8 Hz, 1H), 6.66 (d, J=9.1 Hz, 1H), 4.99 (m, 1H), 4.32 (t, J=10.3 Hz, 1H), 4.21 (dt, J=10.9, 5.4 Hz, 1H), 3.83 (m, 1H), 2.53 (m, 1H), 2.03 (m, 1H). $^{13}$C NMR (151 MHz, CDCl$_3$) δ 168.27, 166.43, 162.04, 158.41, 138.17, 135.00, 132.35, 131.43, 125.90, 123.47, 122.80, 122.71, 122.15, 118.58, 65.31, 60.29, 31.10. FAB-MS (+ve, m/z): 565.7 [MH$^+$]. Anal. Calcd. For $C_{17}H_{14}Cl_2N_2O_4W\cdot0.5CH_2Cl_2$: C, 34.60; H, 2.49; N, 4.61. Found: C, 34.47; H, 2.58; N, 4.52.

Example 208-Synthesis of Emitter 1019

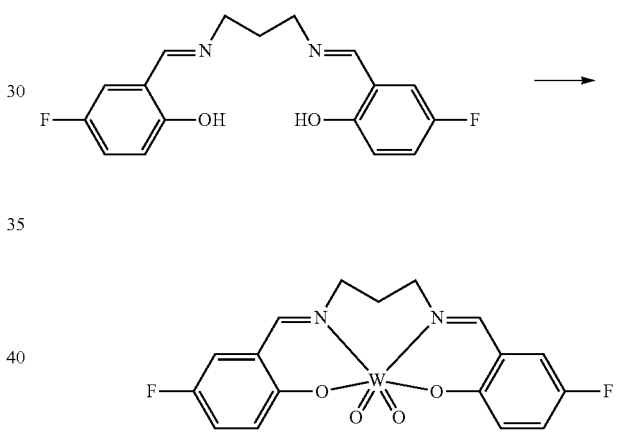

To a degassed solution of the ligand in dry toluene were added $WO_2Cl_2$ and pyridine. The reaction mixture was refluxed for 24 h under $N_2$ atmosphere. The reaction mixture was filtered through celite and the filtrate was collected. The solvent was then removed under reduced pressure and the yellow residue was dissolved in dichloromethane. The addition of diethyl ether to the dichloromethane solution led to the precipitation of a yellow solid which was washed with diethyl ether. The yellow solid was filtered and dried under vacuum. Yield: 42%. $^1$H NMR (400 MHz, CDCl$_3$) δ=8.28 (s, 1H), 8.07 (s, 1H), 7.30-7.24 (m, 1H), 7.19 (ddd, J=9.2, 8.1, 3.2, 1H), 7.07 (m, 2H), 6.97 (dd, J=8.1, 3.2, 1H), 6.68 (dd, J=9.3, 4.5, 1H), 5.01 (m, 1H), 4.30 (m, 1H), 4.21 (m, 1H), 3.84 (m, 1H), 2.52 (m, 1H), 2.05 (m, 1H). $^{13}$C NMR (151 MHz, CDCl$_3$) δ 168.32, 164.53, 162.04, 157.38, 156.16, 155.79, 155.36, 153.78, 126.60, 126.45, 122.55, 122.50, 122.37, 122,22, 121.95, 121.90, 121.22, 121.16, 118.22, 118.06, 116.33, 116.18, 65.05, 60.17, 30.97 (two unresolved due to overlap). $^{19}$F NMR (376 MHz, CDCl$_3$) δ −122.31, −125.89. FAB-MS (+ve, m/z): 532.9 [MH$^+$]. Anal. Calcd. For $C_{17}H_{14}F_2N_2O_4W\cdot1.5\,CH_2Cl_2$: C, 33.69; H, 2.60; N, 4.25. Found: C, 34.05; H, 2.63; N, 4.41.

Example 209-Synthesis of Emitter 1020

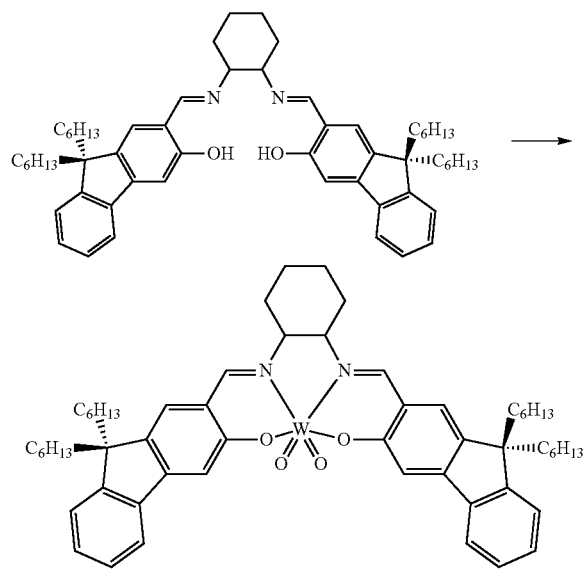

To a degassed solution of the ligand (0.34 g, 0.41 mmol) in dry toluene were added WO$_2$Cl$_2$ and pyridine. The reaction mixture was refluxed for 24 h under N$_2$ atmosphere. The reaction mixture was filtered through celite and the filtrate was collected. The solvent was then removed under reduced pressure and the yellow residue was dissolved in dichloromethane. The addition of diethyl ether to the dichloromethane solution led to the precipitation of a yellow solid which was washed with diethyl ether. The yellow solid was filtered and dried under vacuum. Yield: 51%. $^1$H NMR (500 MHz, CD$_2$Cl$_2$) δ=8.47 (s, 1H), 8.44 (d, J=1.6, 1H), 7.84-7.80 (m, 1H), 7.69 (d, J=7.5, 1H), 7.52 (s, 1H), 7.46-7.38 (m, 6H), 7.38-7.36 (m, 1H), 7.36-7.29 (m, 2H), 7.22 (s, 1H), 4.58-4.48 (m, 1H), 2.98 (t, J=10.7, 1H), 2.61 (d, J=11.2, 1H), 2.45 (d, J=11.6, 1H), 2.09 (s, 2H), 2.00 (dd, J=17.0, 8.9, 6H), 1.95-1.84 (m, 3H), 1.79 (dd, J=24.1, 12.2, 2H), 1.63 (dd, J=26.2, 13.3, 4H), 1.52-1.40 (m, 2H), 1.09 (m, 24H), 0.82-0.67 (m, 12H). $^{13}$C NMR (126 MHz, CD$_2$Cl2) δ=168.55, 163.30, 162.14, 159.10, 153.64, 153.21, 152.34, 149.62, 144.10, 140.88, 140.21, 140.19, 129.91, 129.61, 129.03, 127.75, 127.63, 126.99, 123.87, 123.80, 123.70, 123.57, 122.07, 121.82, 120.74, 111.47, 111.35, 110.20, 74.74, 72.19, 55.30, 54.70, 41.67, 41.17, 41.13, 40.95, 40.71, 32.16, 32.14, 31.85, 30.85, 30.37, 30.31, 30.23, 30.07, 29.39, 25.29, 24.74, 24.56, 24.44, 24.38, 24.25, 23.22, 23.17, 23.12, 23.02, 14.35, 14.23. IR (KBr disk, v/cm$^{-1}$): 937 (m, W=O), 891 (m, W=O). FAB-MS (+ve, m/z): 1049.5 [M$^{30}$]. Anal. Calcd. For CssH$_{76}$N$_2$O$_4$W—CHCl$_3$: C, 60.65; H, 6.64; N, 2.40. Found: C, 60.10; H, 6.96; N, 2.58.

Example 210-Synthesis of Emitter 1021

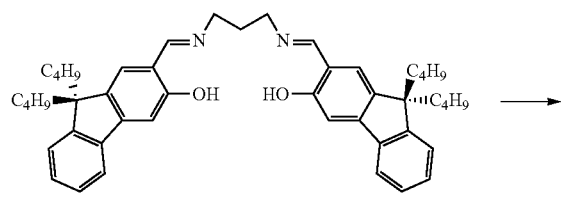

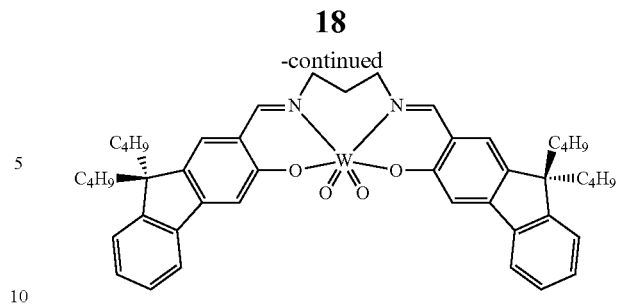

To a degassed solution of the ligand (0.34 g, 0.41 mmol) in dry toluene were added WO$_2$Cl$_2$ and pyridine. The reaction mixture was refluxed for 24 h under N$_2$ atmosphere. The reaction mixture was filtered through celite and the filtrate was collected. The solvent was then removed under reduced pressure and the yellow residue was dissolved in dichloromethane. The addition of diethyl ether to the dichloromethane solution led to the precipitation of a yellow solid which was washed with diethyl ether. The yellow solid was filtered and dried under vacuum. Yield: 70%. $^1$H NMR (500 MHz, CDCl$_3$) δ 8.35 (s, 1H), 8.19 (s, 1H), 7.81-7.75 (m, 1H), 7.55 (d, J=7.6 Hz, 1H), 7.45 (s, 1H), 7.42-7.29 (m, 4H), 7.27 (m, 2H), 7.22 (m, 1H), 7.19 (s, 1H), 6.98 (s, 1H), 5.04 (m, 1H), 4.31 (t, J=10.1 Hz, 1H), 4.21 (m, 1H), 3.90 (m, 1H), 2.54 (m, 1H), 2.13-1.79 (m, 9H), 1.07 (m, 8H), 0.75-0.50 (m, 20H). $^{13}$C NMR (151 MHz, CDCl$_3$) δ=168.60, 167.99, 163.05, 159.96, 152.89, 152.32, 152.05, 148.41, 142.96, 140.38, 139.89, 139.50, 129.33, 128.79, 127.17, 127.00, 126.93, 126.45, 122.95, 121.56, 121.39, 121.27, 111.39, 111.14, 65.05, 60.28, 54.50, 54.00, 40.96, 40.58, 40.34, 40.17, 31.35, 26.09, 26.00, 23.09, 13.95, 13.87, 13.84, 13.77 (two unresolved in the aromatic region due to close chemical shift). FAB-MS (+ve, m/z): 897.0 [MH$^+$]. Anal. Calcd. For C$_{47}$H$_{56}$N$_2$O$_4$W•1.5CH$_2$Cl$_2$: C, 56.88; H, 5.81; N, 2.74. Found: C, 56.31; H, 6.24; N, 2.88.

Example 211-Synthesis of Emitter 1023

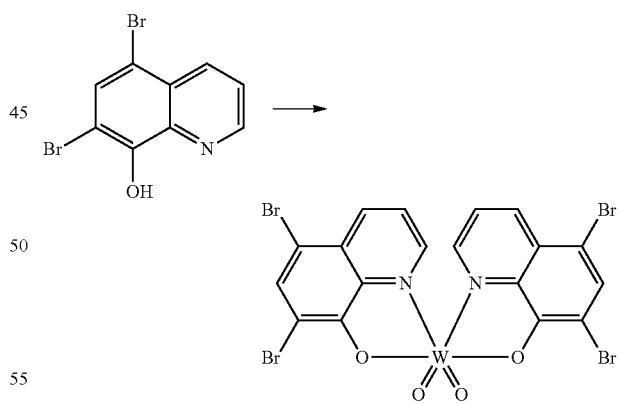

A mixture of ligand (0.15 g, 0.49 mmol) and WO$_2$(acac)$_2$ (0.10, 0.24 mmol) in dry methanol were refluxed under N$_2$ for 12 h and the pale yellow solid was formed. The pale yellow solid was filtered and washed with methanol. Finally, recrystallization of the product from dichloromethane-methanol affords a pale yellow solid. Yield: 60%. $^1$H NMR (400 MHz, CDCl$_3$) δ=8.63 (dd, J=4.8, 1.1, 2H), 8.53 (dd, J=8.5, 1.2, 2H), 8.11 (s, 2H), 7.60 (dd, J=8.5, 4.8, 2H). $^{13}$C NMR (101 MHz, CDCl$_3$) δ =148.50, 139.66, 138.11, 135.92, 127.97, 123.79, 111.04, 110.66. IR (KBr disk, v/cm$^{-1}$): 947 (s, W=O), 915 (vs, W=O). FAB-MS (+ve, m/z): 821.2 [Mt]. Anal. Calcd. For $C_{18}H_8Br_4N_2O_4W$: C, 26.37; H, 0.98; N, 3.42. Found: C, 26.52; H, 1.00; N, 3.57.

Example 212-Synthesis of Emitter 1024

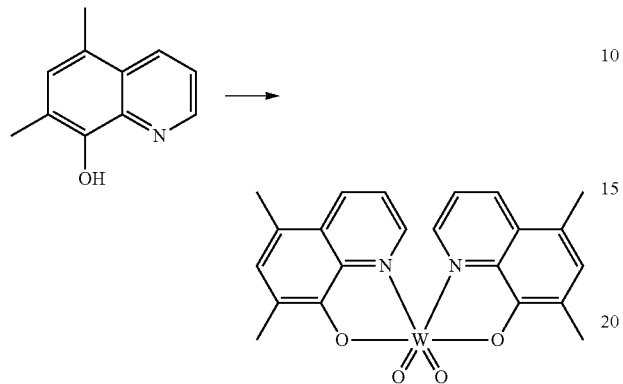

A mixture of ligand (0.17 g, 0.99 mmol) and WO$_2$(acac)$_2$ in dry methanol were refluxed under N$_2$ for 12 h and the pale yellow solid was formed. The pale yellow solid was filtered and washed with methanol. Finally, recrystallization of the product from dichloromethane-methanol affords a pale yellow solid. Yield: 63%. $^1$H NMR (300 MHz, CDCl$_3$) δ=8.49 (dd, J=4.8, 1.3, 2H), 8.26 (dd, J=8.4, 1.4, 2H), 7.39-7.27 (m, 4H), 2.63 (s, 6H), 2.54 (s, 6H). $^{13}$C NMR (101 MHz, CDCl$_3$) δ=146.21, 139.83, 136.04, 132.67, 127.18, 125.70, 125.12, 120.95, 17.24, 15.98. IR (KBr disk, v/cm$^{-1}$): 944 (m, W=O), 901 (m, W=O). ESI-MS (+ve, m/z): 561.3 [M$^{3o}$]. Anal. Calcd. For $C_{22}H_{20}N_2O_4W$: C, 47.16; H, 3.60; N, 5.00. Found: C, 46.91; H, 3.78; N, 5.15.

Example 213-Synthesis of Emitter 1025

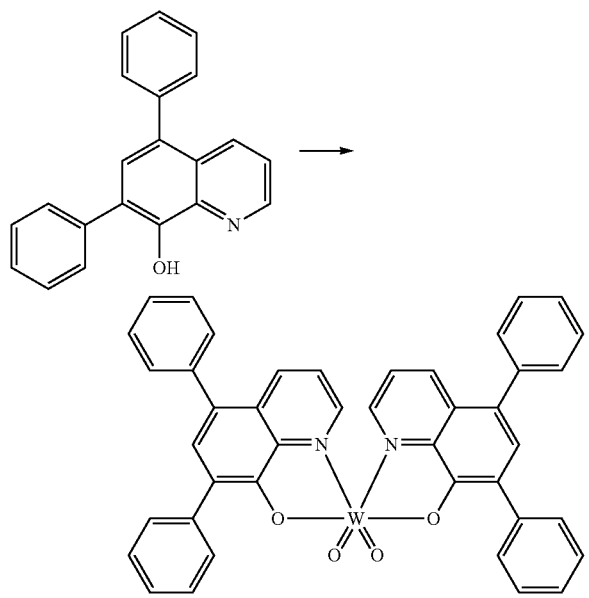

A mixture of ligand (0.18 g, 0.62 mmol) and WO$_2$(acac)$_2$ in dry methanol were refluxed under N$_2$ for 12 h and the pale yellow solid was formed. The pale yellow solid was filtered and washed with methanol. Finally, recrystallization of the product from dichloromethane-methanol affords a pale yellow solid. Yield: 21%. $^1$H NMR (500 MHz, CDCl$_3$) δ=8.62 (dd, J=4.8, 1.3, 1H), 8.35 (dd, J=8.5, 1.4, 1H), 8.11 (dd, J=8.3, 1.1, 2H), 7.89 (s, 1H), 7.58 (t, J=7.8, 2H), 7.52-7.46 (m, 2H), 7.44 (ddd, J=6.0, 5.3, 2.8, 4H), 7.36 (dd, J=8.5, 4.8, 1H). $^{13}$C NMR (126 MHz, CDCl$_3$) δ=155.09, 147.33, 140.69, 137.97, 137.91, 136.17, 132.11, 131.50, 129.95, 129.61, 128.77, 128.12, 127.90, 127.82, 127.25, 122.32. IR (KBr disk, v/cm$^{-1}$): 949 (m, W=O), 917 (m, W=O). FAB-MS (+ve, m/z): 809.6 [M$^{3o}$]. Anal. Calcd. For $C_{42}H_{28}N_2O_4W$·1.5MeOH: C, 60.99; H, 4.00; N, 3.27. Found: C, 60.92; H, 3.69; N, 3.42.

Example 214-Synthesis of Emitter 1026

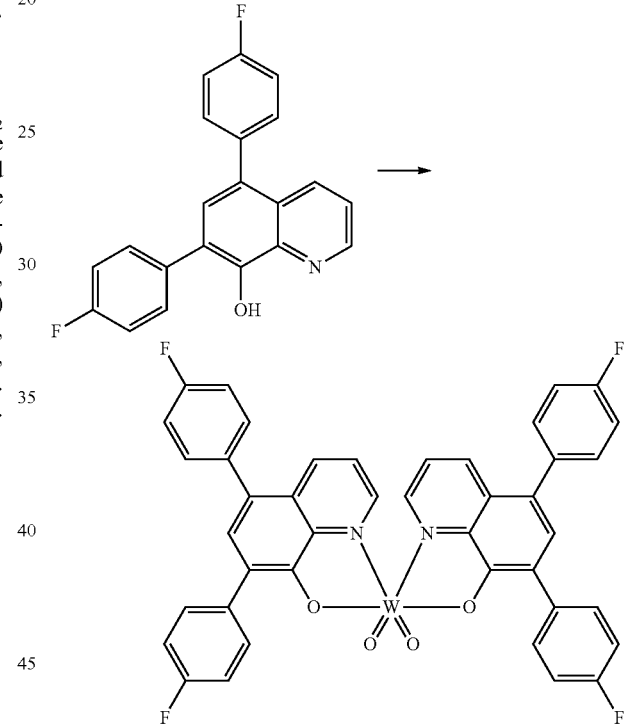

A mixture of ligand (0.21 g, 0.64 mmol) and WO$_2$(acac)$_2$ in dry methanol were refluxed under N$_2$ for 12 h and the pale yellow solid was formed. The pale yellow solid was filtered and washed with methanol. Finally, recrystallization of the product from dichloromethane-methanol affords a pale yellow solid. Yield: 35%. $^1$H NMR (500 MHz, CD$_2$Cl$_2$) δ=8.58 (dd, J=4.8, 1.3, 2H), 8.31 (dd, J=8.5, 1.3, 2H), 8.09-8.04 (m, 4H), 7.82 (s, 2H), 7.46-7.37 (m, 6H), 7.34-7.28 (m, 4H), 7.24-7.18 (m, 4H). $^{13}$C NMR (126 MHz, CD$_2$Cl$_2$) δ=164.25, 164.21, 162.28, 162.24, 155.40, 147.99, 141.07, 138.49, 134.52, 134.49, 133.02, 132.99, 132.23, 132.16, 131.97, 131.91, 131.88, 128.03, 127.42, 123.18, 116.33, 116.28, 116.23, 116.16, 116.11, 51.01, 30.26, 1.34. $^{19}$F NMR (376 MHz, CD$_2$Cl2) δ=−114.16, −114.17, −114.85, −114.87. IR (KBr disk, v/cm$^{-1}$): 942 (m, W=O), 903 (m, W=O). FAB-MS (+ve, m/z): 881.0 [M$^{3o}$]. Anal. Calcd. For $C_{42}H_{24}F_4N_2O_4W$·2H$_2$O: C, 50.04; H, 3.08; N, 3.06. Found: C, 55.04; H, 3.18; N, 3.18.

Example 215-Synthesis of Emitter 1027

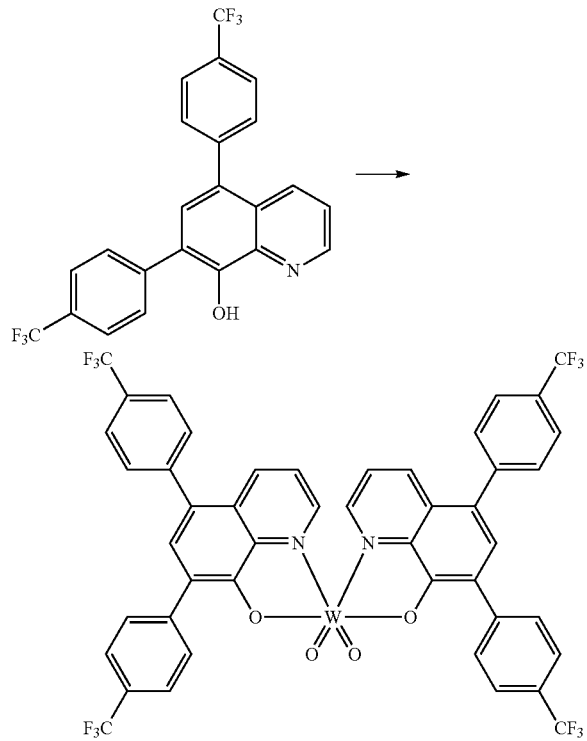

A mixture of ligand (0.21 g, 0.64 mmol) and WO$_2$(acac)$_2$ in dry methanol were refluxed under N$_2$ for 12 h and the pale yellow solid was formed. The pale yellow solid was filtered and washed with methanol. Finally, recrystallization of the product from dichloromethane-methanol affords a pale yellow solid. Yield: 38%. $^1$H NMR (600 MHz, CD$_2$Cl$_2$) δ=8.61 (d, J=5.5, 2H), 8.34 (d, J=9.5, 2H), 8.20 (d, J=8.1, 4H), 7.88 (d, J=8.6, 6H), 7.79 (d, J=8.2, 4H), 7.61 (d, J=8.1, 4H), 7.46 (dd, J=8.5, 4.8, 2H). $^{13}$C NMR (151 MHz, CD$_2$Cl$_2$) δ=156.34, 148.30, 142.00, 141.02, 140.38, 138.37, 131.93, 131.57, 130.06, 130.94, 130.83, 130.71, 130.62, 130.58, 130.56, 130.54, 130.53, 130.47, 130.43, 130.40, 130.37, 130.35, 130.34, 130.32, 130.28, 130.19, 130.07, 128.16, 127.58, 127.47, 126.99, 126.32, 126.30, 126.27, 126.22, 126.20, 126.17, 126.15, 125.78, 125.66, 123.98, 123.86, 123.82, 122.17, 122.06. $^{19}$F NMR (376 MHz, CD$_2$Cl$_2$) δ=−62.81, −62.82. IR (KBr disk, v/cm$^{-1}$): 956 (m, W═O), 921 (s, W═O). FAB-MS (+ve, m/z): 1081.0 [M$^{30}$]. Anal. Calcd. For C$_{46}$H$_{24}$F$_{12}$N$_2$O$_4$W—CH$_3$OH: C, 50.74; H, 2.54; N, 2.52. Found: C, 50.56; H, 2.46; N, 2.79.

Example 216-Synthesis of Emitter 1028

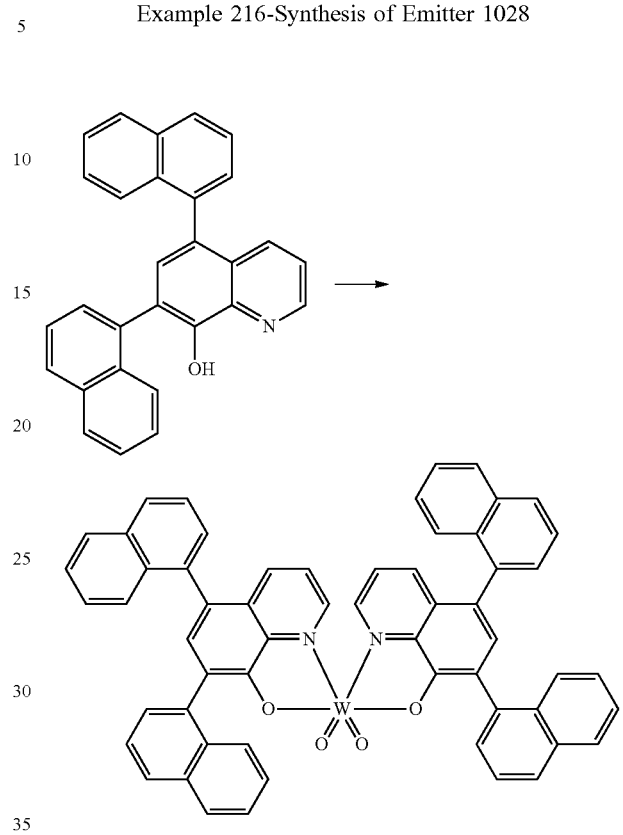

A mixture of ligand (0.21 g, 0.64 mmol) and WO$_2$(acac)$_2$ in dry methanol were refluxed under N$_2$ for 12 h and the pale yellow solid was formed. The pale yellow solid was filtered and washed with methanol. Finally, recrystallization of the product from dichloromethane-methanol affords a pale yellow solid. Yield: 26%. $^1$H NMR (400 MHz, CDCl$_3$) δ=7.96 (dd, J=16.3, 5.9, 15H), 7.79 (s, 3H), 7.67 (s, 3H), 7.52 (dd, J=17.6, 9.8, 15H). IR (KBr disk, v/cm$^{-1}$): 955 (m, W═O), 917 (m, W═O). ESI-MS (+ve, m/z): 1009.4 [M$^{30}$]. Anal. Calcd. For C$_{ss}$H$_{36}$N$_2$O$_4$W•3.5CH$_2$Cl$_2$: C, 56.56; H, 3.32; N, 2.14. Found: C, 56.88; H, 3.31; N, 2.48.

Example 217-Crystal and Structure Determination Data of Emitter 1013, 1017, 1018 and 1027

| Emitter | 1013 | 1017 | 1018 | 1027 |
|---|---|---|---|---|
| Empirical formula | C$_{36}$H$_{52}$N$_2$O$_4$W•CCl$_2$ | C$_{17}$H$_{14}$Br$_2$N$_2$O$_4$W | C$_{17}$H$_{14}$Cl$_2$N$_2$O$_4$W | C$_{46}$H$_{24}$F$_{12}$N$_2$O$_4$W |
| Formula weight | 843.56 | 696.43 | 565.05 | 1080.51 |
| Temperature, K | 173.15 | 100 | 100 | 100 |
| Crystal system | monoclinic | monoclinic | orthorhombic | monoclinic |
| Space group | P2$_1$/c | P2$_1$/c | Pna2$_1$ | P2$_1$/c |
| a, Å | 16.3853(3) | 12.6615(9) | 17.2192(6) | 11.8759(6) |
| b, Å | 16.3268(2) | 20.9422(15) | 12.4077(5) | 48.783(2) |
| c, Å | 17.2980(3) | 16.1922(15) | 16.6195(6) | 17.3960(8) |
| α, ° | 90.00 | 90.00 | 90.00 | 90.00 |
| β, ° | 114.715(2) | 111.528(2) | 90.00 | 97.989(2) |
| γ, ° | 90.00 | 90.00 | 90.00 | 90.00 |
| V, Å$^3$ | 4203.68(12) | 3994.0(5) | 3550.8(2) | 9980.3(8) |
| Z | 4 | 8 | 8 | 8 |
| D$_c$, g cm$^{-3}$ | 1.333 | 2.316 | 2.114 | 1.503 |

-continued

| Emitter | 1013 | 1017 | 1018 | 1027 |
|---|---|---|---|---|
| $\mu$, mm$^{-1}$ | 6.537 | 16.882 | 15.068 | 5.396 |
| F(000) | 1712.0 | 2616 | 2160 | 4428.0 |
| No. of reflections | 31223 | 44633 | 21746 | 16626 |
| No. of independent reflections | 8127 | 7044 | 4761 | 16626 |
| GoF | 1.083 | 1.137 | 1.102 | 1.062 |
| $R_{int}$ | 0.0422 | 0.0468 | 0.0667 | 0.0989 |
| $R_1^{[a]}$, $wR_2^{[b]}$ (I > 2(I)) | 0.0450, 0.1289 | 0.030, 0.0744 | 0.0603, 0.1432 | 0.0911, 0.2277 |

[a]$R_1 = \Sigma ||F_o| - |F_c||/\Sigma |F_o|$.
[b]$wR_2 = [\Sigma w(|Fo^2| - |F_c^2|)^2/\Sigma w|Fo^2|^2]^{1/2}$.
[c]$GoF = [\Sigma w(|F_o| - |F_c|)^2/(N_{obs} - N_{param})]^{1/2}$ Example 218-Selected Bond Lengths (Å) and Bond Angles (°) of Emitter 1013, 1017, 1018 and 1027

| Bond Length (Å) | 1013 | 1017 | 1018 | 1027 |
|---|---|---|---|---|
| W(1)—O(1) | 1.727 (3) | 2.089 (3) | 1.840 (14) | 1.708 (8) |
| W(1)—O(2) | 1.723 (3) | 1.938 (3) | 2.089 (11) | 1.709 (7) |
| W(1)—O(3) | 2.108 (3) | 1.720 (3) | 1.666 (14) | 1.953 (7) |
| W(1)—O(4) | 1.939 (3) | 1.737 (3) | 1.693 (11) | 1.937 (7) |
| W(1)—N(1) | 2.124 (4) | 2.140 (4) | 2.104 (14) | 2.308 (8) |
| W(1)—N(2) | 2.310 (3) | 2.319 (4) | 2.328 (14) | 2.309 (9) |
| W(1)—O(5) |  | 2.091 (3) | 1.904 (12) |  |
| W(1)—O(6) |  | 1.939 (3) | 2.074 (10) |  |
| W(1)—O(7) |  | 1.719 (4) | 1.666 (15) |  |
| W(1)—O(8) |  | 1.735 (4) | 1.730 (11) |  |
| W(1)—N(3) |  | 2.143 (4) | 2.132 (15) |  |
| W(1)—N(4) |  | 2.319 (5) | 2.302 (15) |  |
| O(1)—W(1)—O(2) | 102.52 (15) | 84.11 (13) | 83.1 (5) | 106.2 (4) |
| O(3)—W(1)—O(4) | 86.67 (12) | 102.28 (16) | 102.2 (5) | 150.0 (3) |
| N(1)—W(1)—N(2) | 71.56 (13) | 79.92 (14) | 79.6 (5) | 76.3 (3) |
| O(1)—W(1)—O(3) | 164.56 (12) | 91.39 (14) | 101.7 (5) | 93.7 (3) |
| O(1)—W(1)—O(4) | 100.39 (15) | 163.18 (14) | 103.1 (5) | 104.4 (3) |
| O(2)—W(1)—O(3) | 88.57 (14) | 173.59 (15) | 163.3 (5) | 102.0 (3) |
| O(2)—W(1)—O(4) | 105.55 (14) | 102.42 (15) | 92.1 (5) | 95.8 (3) |
| O(1)—W(1)—N(1) | 89.91 (14) | 80.28 (14) | 80.3 (5) | 161.9 (4) |
| O(1)—W(1)—N(2) | 82.50 (13) | 83.34 (13) | 155.4 (5) | 90.3 (3) |
| O(2)—W(1)—N(1) | 99.65 (15) | 157.06 (14) | 78.4 (5) | 88.9 (3) |
| O(2)—W(1)—N(2) | 170.05 (14) | 81.67 (14) | 79.0 (5) | 162.3 (3) |
| N(1)—W(1)—O(3) | 77.53 (12) | 95.63 (15) | 86.6 (5) | 72.9 (3) |
| N(1)—W(1)—O(4) | 149.82 (13) | 88.57 (15) | 169.5 (5) | 83.6 (3) |
| N(2)—W(1)—O(3) | 85.00 (12) | 173.59 (15) | 91.2 (5) | 83.0 (3) |
| N(2)—W(1)—O(4) | 81.69 (12) | 82.32 (14) | 94.4 (5) | 73.3 (3) |
| O(5)—W(1)—O(6) |  | 87.15 (14) | 84.8 (5) |  |
| O(7)—W(1)—O(8) |  | 103.05 (17) | 103.8 (5) |  |
| N(3)—W(1)—N(4) |  | 80.81 (17) | 79.1 (5) |  |
| O(5)—W(1)—O(7) |  | 91.26 (15) | 90.1 (5) |  |
| O(5)—W(1)—O(8) |  | 160.95 (15) | 162.4 (5) |  |
| O(6)—W(1)—O(7) |  | 101.29 (16) | 101.5 (5) |  |
| O(6)—W(1)—O(8) |  | 102.03 (16) | 102.5 (5) |  |
| O(5)—W(1)—N(3) |  | 78.79 (15) | 78.3 (5) |  |
| O(5)—W(1)—N(4) |  | 77.47 (17) | 80.2 (5) |  |
| O(6)—W(1)—N(3) |  | 159.41 (16) | 155.8 (5) |  |
| O(6)—W(1)—N(4) |  | 81.50 (16) | 81.2 (5) |  |
| N(3)—W(1)—O(7) |  | 94.05 (17) | 95.7 (5) |  |
| N(3)—W(1)—O(8) |  | 87.60 (17) | 89.5 (5) |  |
| N(4)—W(1)—O(7) |  | 168.30 (18) | 169.7 (5) |  |
| N(4)—W(1)—O(8) |  | 87.31 (19) | 85.1 (5) |  |

The perspective views are attached as FIG. 1-4 respectively.

Example 219-Photophysical Data

| Emitter | Medium (T/K) | $\lambda_{abs}$ [nm] ($\varepsilon$ [mol$^{-1}$ dm$^3$ cm$^{-1}$])[a] | $\lambda_{max}$/nm ($\tau$/μs) | $\Phi_{sol}$[a,b] | $\Phi_{film}$[d] |
|---|---|---|---|---|---|
| 1012 | DCM (298) | 243 (sh, 32500), 271 (sh, 18210), 301 (sh, 9870), 358 (sh, 2670), 400 (4050) | 595 (14.6) | 0.003 | |
| | Solid (298) | | 550 (14.5) | | |
| | Solid (77) | | 584 (354.4) | | |
| | Glass (77)[c] | | 569 (710.4) | | |
| 1013 | DCM (298) | 248 (sh, 20560), 275 (sh, 14480), 312 (sh, 7140), 362 (sh, 3170), 415 (2760) | 625 (10.0) | 0.002 | |
| | Solid (298) | | 608 (19.1) | | |
| | Solid (77) | | 524 sh, 613 (161.0) | | |
| | Glass (77)[c] | | 608 (190.4) | | |
| 1014 | DCM (298) | 240 (sh, 31150), 308 (sh, 8610), 358 (sh, 3240), 418 (3280) | 618 (16.4) | 0.003 | |
| | Solid (298) | | 602 (72.3) | | |
| | Solid (77) | | 517 sh, 609 (196.5) | | |
| | Glass (77)[c] | | 498 (212.9) | | |
| 1015 | DCM (298) | 243 (35100), 273 (sh, 17600), 299 (sh, 12600), 400 (3800) | 600 (96.9) | 0.028 | |
| | Solid (298) | | 567 (21.6) | | |
| | Solid (77) | | 570 (491) | | |
| | Glass (77)[c] | | 563 (980) | | |
| | Thin film (298) | | | | |
| | 5% in MCP | | 580 | | 0.22 |
| | 3% in PMMA | | 580 | | 0.051 |
| 1016 | DCM (298) | 245 (22100), 283 (sh, 11700), 312 (sh, 8500), 417 (2300) | 657 (25.7) | 0.008 | |
| | Solid (298) | | 652 (47.3) | | |
| | Solid (77) | | 658 (106) | | |
| | Glass (77)[c] | | 599 (637) | | |
| 1017 | DCM (298) | 248 (37600), 297 (sh, 10100), 413 (3200) | 622 (77.9) | 0.016 | |
| | Solid (298) | | 604 (24.8) | | |
| | Solid (77) | | 608 (320) | | |
| | Glass (77)[c] | | 582 (855) | | |
| 1018 | DCM (298) | 246 (41400), 274 (sh, 17300), 297 (sh, 11000), 414 (3700) | 623 (56.2) | 0.010 | |
| | Solid (298) | | 603 (22.6) | | |
| | Solid (77) | | 609 (498) | | |
| | Glass (77)[c] | | 581 (865) | | |
| 1019 | DCM (298) | 244 (23700), 274 (sh, 10100), 413 (3200) | 639 (37.2) | 0.014 | |
| | Solid (298) | | 629 (30.2) | | |
| | Solid (77) | | 619 (186) | | |
| | Glass (77)[c] | | 595 (500) | | |
| 1020 | DCM (298) | 271 (25650), 312 (sh, 24290), 330 (sh, 29290), 350 (30190), 427 (8560) | 516 sh, 598 (62.0) | 0.021 | |
| | DMF (298) | 293 (31850), 309 (35290), 330 (36590), 349 (sh, 35020), 427 (9750) | 513 sh, 597 (31.0) | 0.023 | |
| | DMSO (298) | 293 (34850), 309 (36710), 341 (sh, 36120), 423 (9990) | 515 sh, 597 (53.6) | 0.024 | |

-continued

| Emitter | Medium (T/K) | λ$_{abs}$ [nm] (ε [mol$^{-1}$ dm$^3$ cm$^{-1}$])[a] | λ$_{max}$/nm (τ/μs) | Φ$_{sol}$[a,b] | Φ$_{film}$[d] |
|---|---|---|---|---|---|
| | THF (298) | 268 (30350), 293 (24710), 310 (30700), 324 (34770), 346 (sh, 32840), 427 (8360) | 517 sh, 599 (73.2) | 0.013 | |
| | Acetone (298) | 350 (sh, 33750), 423 (9960) | 517 sh, 596 (21.4) | 0.010 | |
| | ACN (298) | 268 (34760) 312 (33780), 324 (sh, 35130), 422 (9930) | 516 sh, 597 (13.0) | 0.009 | |
| | Toluene (298) | 327 (36430), 347 (sh, 35560), 428 (sh, 10300) | 516 sh, 605 (40.0) | 0.013 | |
| | Solid (298) | | 540 (6.0) | | |
| | Solid (77) | | 604 (432.6) | | |
| | Glass (77)[c] | | 575 (690.4) | | |
| | Thin film (298) | | | | |
| | 1% in MCP | | 603 | | 0.110 |
| | 3% in MCP | | 603 | | 0.109 |
| | 5% in MCP | | 603 | | 0.104 |
| | 7% in MCP | | 604 | | 0.105 |
| | 9% in MCP | | 604 | | 0.102 |
| 1021 | DCM (298) | 266 (25100), 327 (29300), 348 (28200), 426 (7700) | 600 (16.0) | 0.006 | |
| | Solid (298) | | 575 (2.7)) | | |
| | Solid (77) | | 593 (292) | | |
| | Glass (77)[c] | | 574 (1593) | | |
| 1023 | DCM (298) | 263 (47450), 375 (7060) | 490, 585 (75.9) | 0.003 | |
| | Solid (298) | | 481 (0.2) | | |
| | Solid (77) | | 484 (0.3), 600 (9.4) | | |
| | Glass (77)[c] | | 505 (0.3), 603 (30.5) | | |
| 1024 | DCM (298) | 258 (37490), 385 (4450) | 515, 600 (10.4) | 0.001 | |
| | Solid (298) | | 498 (0.2) | | |
| | Solid (77) | | 493 (0.4), 592 (4.5) | | |
| | Glass (77)[c] | | 504 (0.2), 594 (94.8) | | |
| 1025 | DCM (298) | 287 (59330), 396 (10480) | 515, 614 (42.0) | 0.012 | |
| | Solid (298) | | 484 (0.2) | | |
| | Solid (77) | | 489 (0.7), 605 (106.0) | | |
| | Glass (77)[c] | | 502 (0.6), 597 (102.0), 633 (sh, 495.5) | | |
| 1026 | DCM (298) | 284 (62060), 390 (11570) | 513, 616 (62.0) | 0.008 | |
| | Solid (298) | | 518 (0.4) | | |
| | Solid (77) | | 512 (0.4), 618 (108.3), 671 (sh, 110.0) | | |
| | Glass (77)[c] | | 480 (<0.1), 598 (473.0), 638 (sh, 384.0) | | |
| | Thin film (298) | | | | |
| | 1% in MCP | | 505, 643 | | 0.037 |
| | 3% in MCP | | 506, 644 | | 0.028 |
| | 5% in MCP | | 508, 646 | | 0.025 |
| | 7% in MCP | | 504, 650 | | 0.023 |
| | 9% in MCP | | 507, 642 | | 0.021 |
| 1027 | DCM (298) | 283 (89190), 382 (13370) | 501, 602 (25.4) | 0.012 | |
| | THF (298) | 284 (99250), 383 (14100) | 502, 604 (30.0) | 0.009 | |
| | ACN (298) | 282 (88380), 382 (14410) | 507, 595 (46.7) | 0.006 | |
| | Toluene (298) | 291 (84170), 386 (12760) | 497, 603 (28.1) | 0.012 | |

-continued

| Emitter | Medium (T/K) | $\lambda_{abs}$ [nm] ($\varepsilon$ [mol$^{-1}$ dm$^3$ cm$^{-1}$])[a] | $\lambda_{max}$/nm ($\tau$/μs) | $\Phi_{sol}$[a,b] | $\Phi_{film}$[d] |
|---|---|---|---|---|---|
| | Solid (298) | | 490 (0.6) | | |
| | Solid (77) | | 485 (0.3), 598 (90.9) | | |
| | Glass (77)[c] | | 509 (0.2), 611 (887.9) | | |
| 1028 | DCM (298) | 262 (43480), 283 (41740), 292 (42040), 383 (9040) | 520, 598 (12.7) | 0.004 | |
| | Solid (298) | | 501 (0.3) | | |
| | Solid (77) | | 518 (0.3), 614 (0.5) | | |
| | Glass (77)[c] | | 496 (0.4), 578 (614.8), 619 (sh, 549.7) | | |

[a]Abbreviations:
$\varepsilon$ = extinction coefficient;
$\tau$ = lifetime;
$\Phi$ = emission quantum yield.
[b]Solution emission quantum yield ($\Phi$sol) was measured with [Ru(bpy)$_3$][PF$_6$]$_2$ (bpy = 2,2'-bipyridine) ($\phi r$ = 0.062) in degassed acetonitrile as a standard reference.
[c]In DCM/MeOH/EtOH mixture (v:v:v = 1:1:4).
[d]Film quantum yield ($\Phi_{film}$) doped into MCP; $\lambda_{ex}$ = 340 nm.

Example 220-fs-TRF Measurements

The measurement was performed based on a commercial Ti:Sapphire regenerative amplifier laser system (800 nm, 40 fs, 1 kHz, and 3.5 mJ/pulse) with excitation at 350 nm wavelength. The 350 nm pump laser was produced by an optical parametric amplifier pumped by part of the 800 nm fundamental laser pulse. The fs-TRF spectra were measured by employing the Kerr-gate technique. A Kerr device composed of a crossed polarizer pair and in between a 1 mm thick Kerr medium (benzene contained in a quartz cell) was driven by part of the 800 nm laser (probe pulse) to work as an ultrafast optical shutter to sample transient fluorescence spectra at the various selected pump/probe delays. The temporal delay of the probe to pump pulse was controlled by an optical delay line. The fs-TRF signals were collected by a monochromator and detected with liquid nitrogen cooled CCD detector. For the measurement of ns-TRE, an intensified CCD (ICCD) detector, which was synchronized to the fs laser system, was used to detect transient emission spectra with the controlled pump/probe time delay covering from ~2 ns and afterwards. To eliminate the effect of rotational diffusion, the polarization direction of the pump laser was set at the magic angle in relative to that of probe for all the measurements. The measurement was done at room temperature and atmospheric pressure with sample solution (~5×10$^{-4}$ M, in CH$_2$Cl$_2$) flowed in a cell of 0.5 mm path length. The sample solution was monitored by UV-Vis absorption and revealed no degradation after the fs-TRF measurement.

Example 221-DFT Calculations of Emitter 1012, 1015 and 1027

Figure 5:
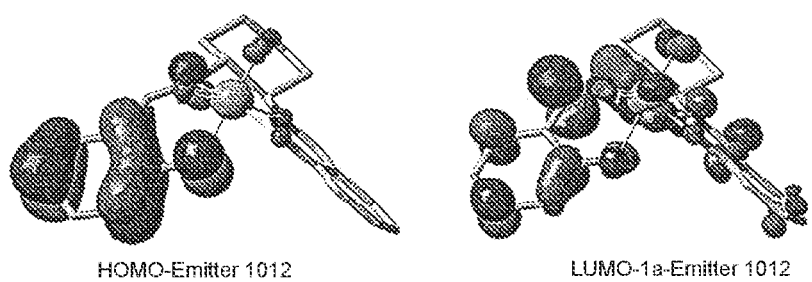
FIG. 5: Plots of HOMO and LUMO of Emitter 1012.
Figure 6:
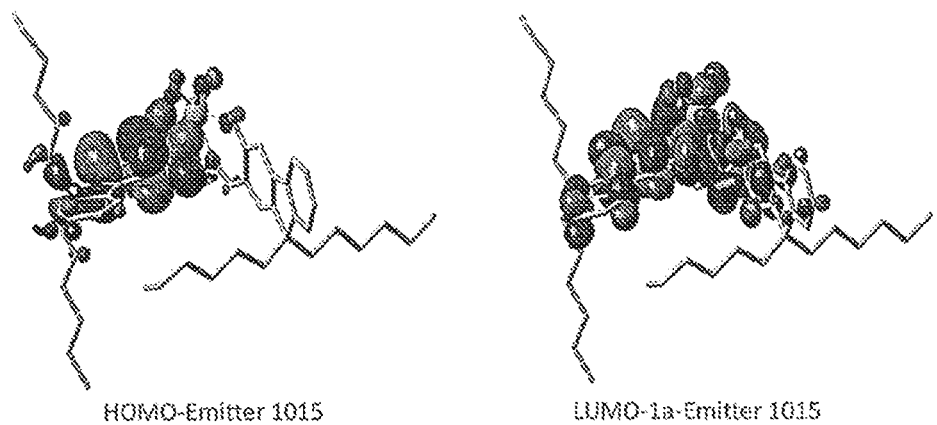
FIG. 6: Plots of HOMO and LUMO of Emitter 1015.
Figure 7:
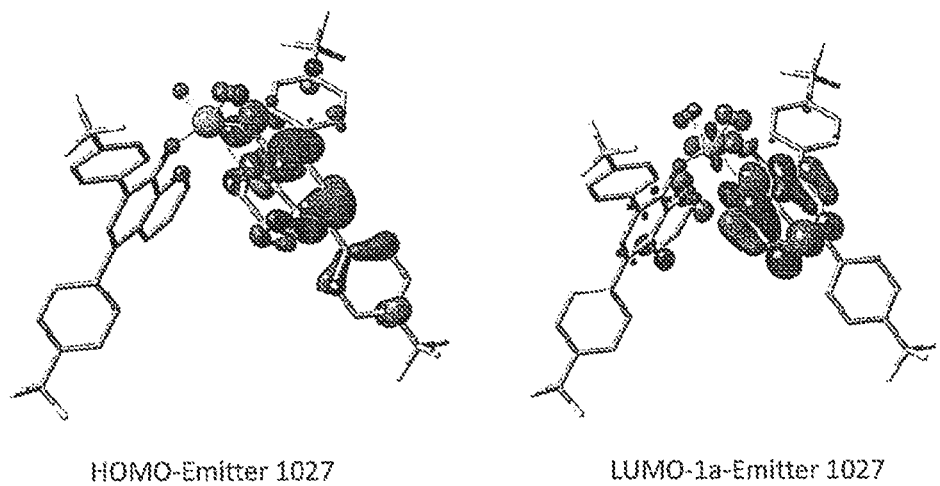
FIG. 7: Plots of HOMO and LUMO of Emitter 1027.

Density functional theory (DFT) and time-dependent density functional theory (TDDFT) calculations have been performed to study the geometries and the electronic structures of Tunsten(VI) complexes (Emitter 1012, 1015 and 1027) using Gaussian 09 package. PBE0/6-31G*(lanl2dz) was used for the geometry optimization and M062X/6-311G*(lanl2dz) for the TDDFT calculation of the triplet state emission energy. The Solvent effects (solvent=dichloromethane) have been considered using self-consistent reaction field (SCRF) method based on PCM models. The result is depicted in FIG. 5-7 respectively.

Example 222-Electrochemical Data for the Emitters[a]

| Complex[b] | $E_{pa}$/V[c] | $E_{pc}$/V[c] | HOMO/eV[d] | LUMO/eV[e] |
|---|---|---|---|---|
| 1012 | +1.15 | −1.89 | −5.90 | −2.86 |
| 1013 | +0.96 | −1.93 | −5.71 | −2.82 |
| 1014 | +1.26 | −1.48 | −6.01 | −3.27 |
| 1015 | +1.20 | −1.95 | −5.95 | −2.80 |
| 1016 | +0.97 | −1.96 | −5.72 | −2.79 |
| 1017 | +1.24 | −1.82 | −5.99 | −2.93 |
| 1018 | +1.23 | −1.68 | −5.98 | −3.07 |
| 1019 | +1.20 | −1.77 | −5.95 | −2.98 |
| 1020 | +1.07 | −1.77 | −5.82 | −2.98 |
| 1021 | +1.08 | −1.78 | −5.83 | −2.97 |
| 1023 | —[f] | −1.57 | — | −3.18 |
| 1024 | +1.10 | −1.95 | −5.85 | −2.80 |
| 1025 | +1.15 | −1.82 | −5.90 | −2.93 |
| 1026 | +1.16 | −1.77 | −5.91 | −2.98 |
| 1027 | +1.28 | −1.70 | −6.03 | −3.05 |
| 1028 | +1.26 | −1.84 | −6.01 | −2.91 |

[a]Scan rate = 100 mVs$^{-1}$.
[b]Cyclic voltammogram was recorded in degassed ACN.
[c]Versus ferrocene/ferrocenium couples. Epa and Epc were the peak anodic and peak cathodic potentials, respectively.
[d]Estimated from the oxidation potentials. $E_{HOMO}$ = −e (4.75 V + Epa).
[e]Estimated from the reduction potentials. $E_{LUMO}$ = −e (4.75 V + $E_{pc}$).
[f]No oxidation potential could be observed in this solvent window.

Example 223-OLED Fabrication Procedures

Materials: PEDOT:PSS [poly(3,4-ethylenedioxythiophene):poly(styrene sulfonic acid)] (Clevios P Al 4083) was purchased from Heraeus, PVK (polyvinylcarbazole) from Sigma-Aldrich, OXD-7 [(1,3-bis[(4-tert-butylphenyl)-1,3,4-oxadiazolyl]phenylene)], PYD2 (2,6-dicarbazolo-1,5-pyridine), B3PYMPM [4,6-Bis(3,5-di(pyridin-3-yl)phenyl)-2-methylpyrimidine], DPEPO (bis{2-[di(phenyl)phosphino]phenyl}ether oxide) and TPBi [2,2',2"-(1,3,5-benzinetriyl)-tris(1-phenyl-1-H-benzimidazole)] from Luminescence Technology Corp. All of the materials were used as received.

Substrate cleaning: Glass slides with pre-patterned ITO electrodes used as substrates of OLEDs were cleaned in an ultrasonic bath of Decon 90 detergent and deionized water, rinsed with deionized water, and then cleaned in sequential ultrasonic baths of deionized water, acetone, and isopropanol, and subsequently dried in an oven for 1 h.

Fabrication and characterization of devices: PEDOT:PSS were spin-coated onto the cleaned ITO-coated glass substrate and baked at 120° C. for 20 minutes to remove the residual water solvent in a clean room. Blends of emitting layer were spin-coated from chlorobenzene atop the PEDOT:PSS layer inside a $N_2$-filled glove box. The thickness for all EMLs was about 60 nm. Afterwards, devices with PVK and PYD2 hosts were respectively annealed at 110 and 70° C. for 10 min inside the glove box and subsequently transferred into a Kurt J. Lesker SPECTROS vacuum deposition system without exposing to air. Finally, B3PYMPM or DPEPO (10 nm), TPBi (40 nm), LiF (1.2 nm), and Al (150 nm) were deposited in sequence by thermal evaporation at a pressure of $10^{-8}$ mbar. EL spectra, luminance and CIE coordination were measured by a Konica Minolta CS2000 Spectroradiometer. Voltage-current characteristics were measured by a Keithley 2400 source-meter measurement unit. All devices were characterized at room temperature without encapsulation. EQE and power efficiency were calculated by assuming a Lambertian distribution.

Example 224-Performance of OLEDs Fabricated by Emitter 1015

Figure 8:
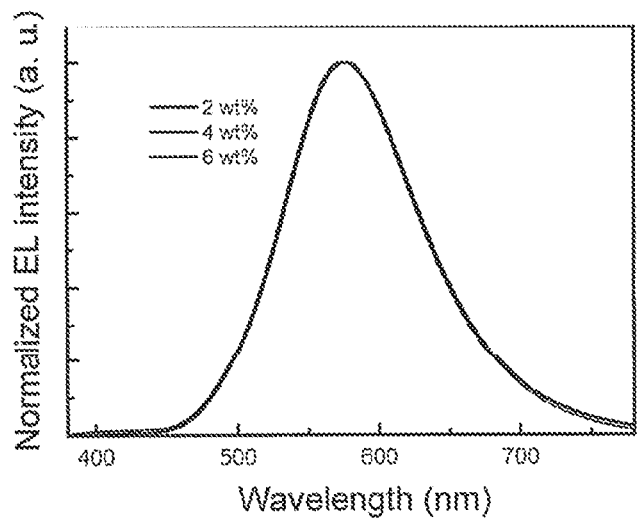
FIG. 8: EL spectrum of device fabricated with emitter 1015.
Figure 9:
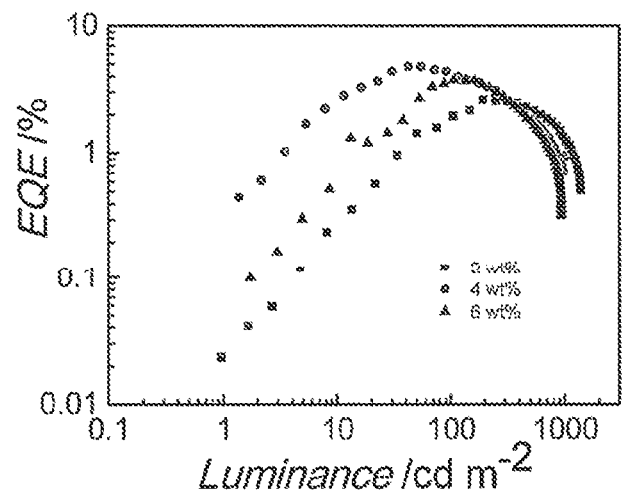
FIG. 9: EQE-luminance relationship of device fabricated with emitter 1015.
Figure 10:
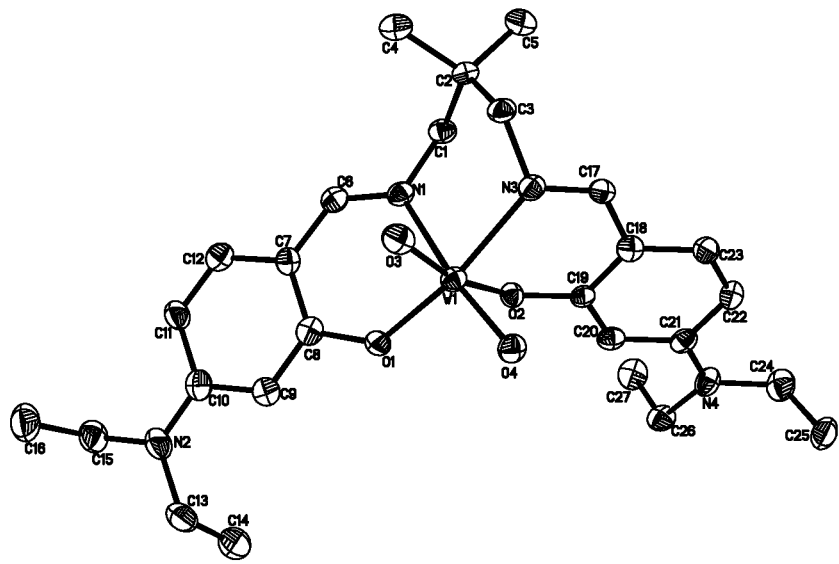
FIG. 10: Perspective view of the x-ray crystal structure of emitter 1031.
Figure 11:
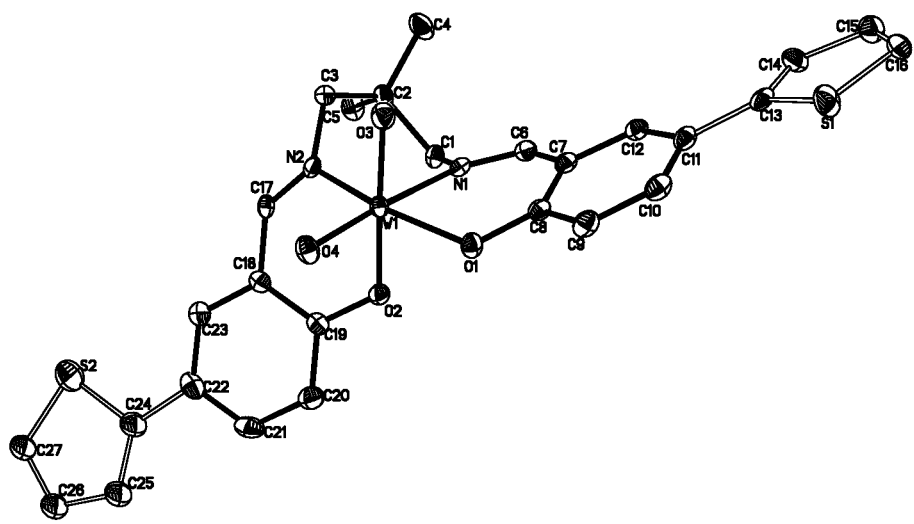
FIG. 11: Perspective view of the x-ray crystal structure of emitter 1034.

The doping concentrations for Emitter 1015 ranged from 2 to 6 wt %. As depicted in FIG. 8, EL spectra of the Emitter 1015 device displayed a broad featureless emission with a maximum located at 577 nm. Such emission was in accordance with the PL spectrum of Emitter 1015 in mCP thin film and kept unchanged with increasing dopant concentration, suggesting efficient energy transfer from the PYD2 host to the emitter. EQE-luminance characteristics of Emitter 1015 devices with 2, 4, and 6 wt % dopant concentrations are depicted in FIG. 9. Maximum EQE of 4.79% was achieved in the device with 4 wt % Emitter 1015 at the luminance of ~40 cd $m^{-2}$. High luminance up to 1400 cd $m^{-2}$ was realized in the device with 2 wt % Emitter 1015.

Example 225-Synthesis of Emitter 1029

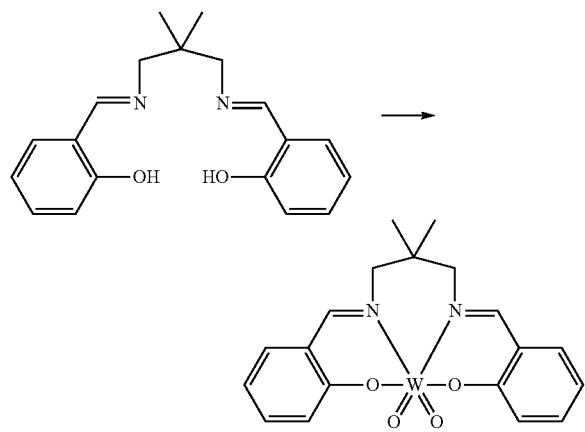

To a mixture of the ligand (100 mg, 0.32 mmol) and $WO_2(dme)Cl_2$ (121 mg, 0.32 mmol) suspended in 20 mL anhydrous dichloromethane, anhydrous $NEt_3$ (90 uL, 0.65 mmol) was added. The reaction mixture was heated to reflux overnight under $N_2$ atmosphere. The crude product was filtered through celite to remove the insoluble. The filtrate was collected and extracted with water and dichloromethane. Solvents were removed at reduced pressure. Subsequent column chromatography with hexane or dichloromethane/ethyl acetate (4:1) yielded the product as a yellow solid. Yield: 82.3%. $^1$H NMR (400 MHz, $CDCl_3$): δ 8.18 (s, 1H), 8.05 (s, 1H), 7.53-7.57 (m, 1H), 7.38-7.43 (m, 2H), 7.31 (dd, 1H, J=1.6 Hz and 7.9 Hz), 7.12 (d, 1H, J=8.2 Hz), 7.01 (t, 1H, J=7.4 Hz), 6.73 (t, 1H, J=7.1 Hz), 6.63 (d, 1H, J=8.6 Hz), 4.91 (d, 1H, J=11.2 Hz), 4.35 (d, 1H, J=12.1 Hz), 3.72 (d, 1H, J=11.1 Hz), 3.41 (d, 1H, J=12.6 Hz), 1.65 (s, 3H), 0.78 (s, 3H); $^{13}C\{^1H\}$ NMR (125 MHz, $CDCl_3$): 168.7, 168.2, 163.9, 160.3, 138.2, 135.1, 133.3, 133.2, 123.0, 122.2, 121.2, 121.0, 120.6, 118.1, 72.6, 37.7, 26.0, 23.5.

Example 226-Synthesis of Emitter 1030

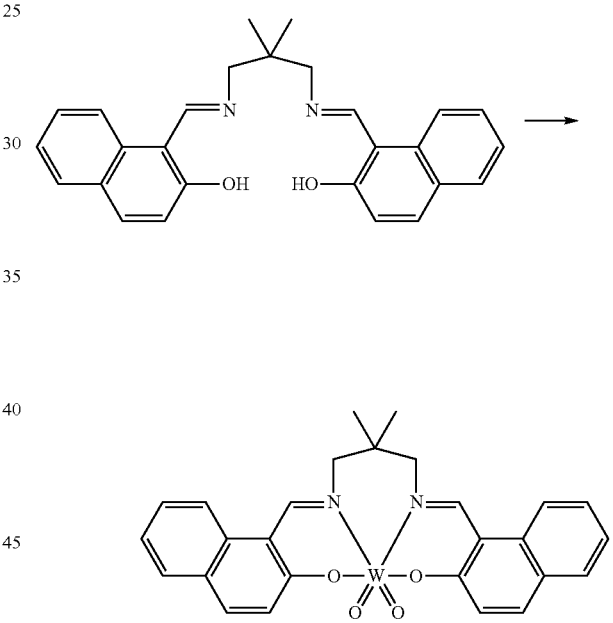

To a mixture of the ligand (100 mg, 0.24 mmol) and $WO_2(dme)Cl_2$ (92 mg, 0.24 mmol) suspended in 20 mL anhydrous dichloromethane, anhydrous NEt3 (71 uL, 0.50 mmol) was added. The reaction mixture was heated to reflux overnight under $N_2$ atmosphere. The crude product was filtered through celite to remove the insoluble. The filtrate was collected and extracted with water and dichloromethane. Solvents were removed at reduced pressure. Subsequent column chromatography with hexane or dichloromethane/ethyl acetate (4:1) yielded the product as a yellow solid. Yield: 27.3%. $^1$H NMR (400 MHz, $CDCl_3$): δ 8.78 (s, 1H), 8.68 (s, 1H), 8.03 (d, 1H, J=9.0 Hz), 8.00 (d, 1H, J=8.6 Hz), 7.88 (d, 1H, J=8.1 Hz), 7.79 (d, 1H, J=8.3 Hz), 7.73 (d, 1H, J=9.2 Hz), 7.64 (d, 1H, J=7.8 Hz), 7.59 (t, 1H, J=7.3 Hz), 7.53 (t, 1H, J=7.2 Hz), 7.45 (t, 1H, J=7.5 Hz), 7.33 (t, 2H, J=9.1 Hz), 6.56 (d, 1H, J=9.2 Hz), 4.93 (d, 1H, J=11.3 Hz), 4.72 (d, 1H, J=12.4 Hz), 3.89 (d, 1H, J=11.4 Hz), 3.50 (d, 1H, J=12.5 Hz), 1.20 (s, 3H), 0.74 (s, 3H).

Example 227-Synthesis of Emitter 1031

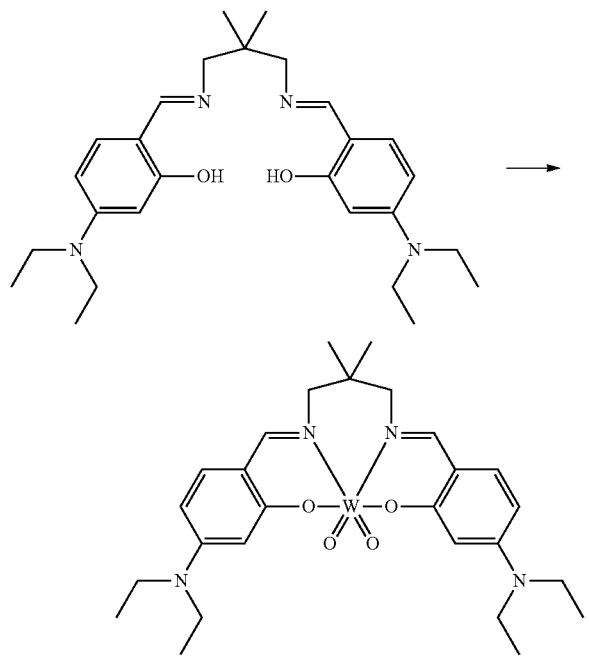

To a mixture of the ligand (111 mg, 0.25 mmol) and WO₂(dme)Cl₂ (94 mg, 0.25 mmol) suspended in 20 mL anhydrous dichloromethane, anhydrous NEt₃ (69 uL, 0.50 mmol) was added. The reaction mixture was heated to reflux overnight under N₂ atmosphere. The crude product was filtered through celite to remove the insoluble. The filtrate was collected and extracted with water and dichloromethane. Solvents were removed at reduced pressure. Subsequent column chromatography with hexane or dichloromethane/ ethyl acetate (4:1) yielded the product as a yellow solid. Yield: 55.1%. $^1$H NMR (400 MHz, CDCl₃): δ 7.86 (s, 1H), 7.81 (s, 1H), 7.11 (dt, 2H, J=10.1 Hz and 2.2 Hz), 6.32 (d, 1H, J=2.2 Hz), 6.27 (dd, 1H, J=8.7 Hz and 2.3 Hz), 6.18 (dd, 1H, J=9.0 Hz and 2.3 Hz), 5.96 (d, 1H, J=2.0 Hz), 4.66 (d, 1H, J=11.6 Hz), 3.63-3.66 (m, 2H), 3.31-3.43 (m, 9H), 1.13-1.21 (m, 12H), 1.11 (s, 3H), 0.82 (s, 3H); $^{13}$C{$^1$H} NMR (125 MHz, CDCl₃): δ 170.2, 164.4, 162.8, 162.2, 155.9, 153.2, 135.5, 135.0, 114.1, 112.2, 105.6, 105.2, 101.3, 99.3, 78.1, 75.4, 71.2, 44.8, 44.6, 37.5, 25.8, 25.3, 12.9, 12.8.

Example 228-Synthesis of Emitter 1032

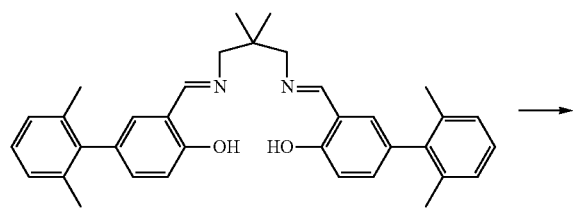

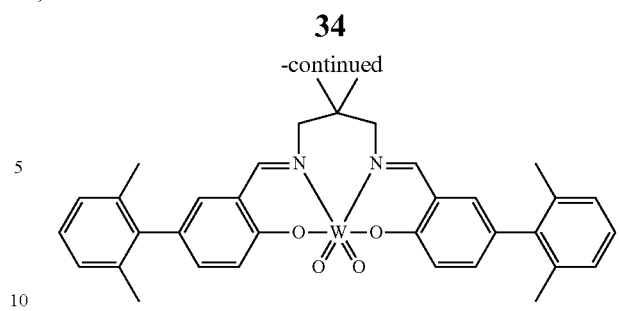

To a mixture of the ligand (92 mg, 0.18 mmol) and WO₂(dme)Cl₂ (67 mg, 0.18 mmol) suspended in 10 mL anhydrous dichloromethane, anhydrous NEt₃ (50 uL, 0.36 mmol) was added. The reaction mixture was heated to reflux overnight under N₂ atmosphere. The crude product was filtered through celite to remove the insoluble. The filtrate was collected and extracted with water and dichloromethane. Solvents were removed at reduced pressure. Subsequent column chromatography with hexane or dichloromethane/ ethyl acetate (4:1) yielded the product as a yellow solid. Yield: 37.5%. $^1$H NMR (400 MHz, CDCl₃): δ 8.19 (s, 1H), 8.05 (s, 1H), 7.34 (dd, 1H, J=1.9 Hz and 8.4 Hz), 7.23-7.25 (m, 1H), 7.08-7.19 (m, 9H), 6.72 (d, 1H, J=8.6 Hz), 4.95 (d, 1H, J=11.1 Hz), 4.41 (d, 1H, J=12.4 Hz), 3.76 (d, 1H, J=11.2 Hz), 3.45 (d, 1H, J=12.6 Hz), 2.09 (s, 3H), 2.07 (s, 6H), 2.01 (s, 3H), 1.18 (s, 3H), 0.84 (s, 3H); $^{13}$C{$^1$H} NMR (125 MHz, CDCl₃): 168.7, 167.1, 163.9, 159.1, 140.1, 140.0, 139.8, 137.0, 136.4 (8), 136.4 (2), 136.2, 136.1, 133.9, 133.4, 133.0, 130.7, 127.5, 127.4, 127.3 (8), 127.3 (4), 127.2 (8), 127.2 (2), 123.1, 122.2, 121.3, 120.8, 76.9, 73.1, 37.8, 26.0, 23.7, 21.0, 20.9, 20.8.

Example 229-Synthesis of Emitter 1033

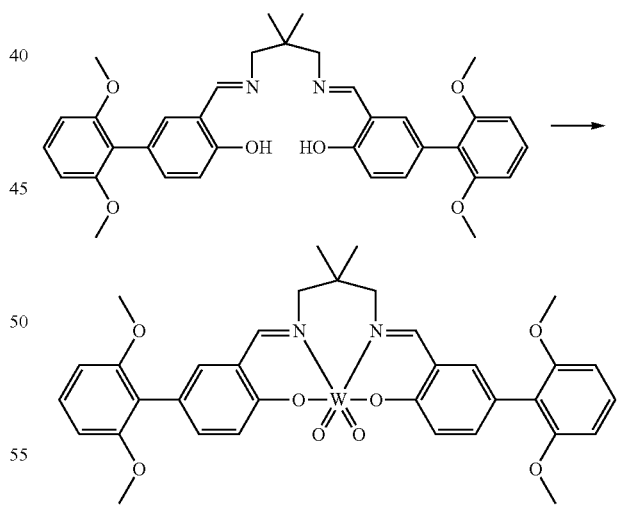

To a mixture of the ligand (100 mg, 0.17 mmol) and WO₂(dme)Cl₂ (65 mg, 0.17 mmol) suspended in 10 mL anhydrous dichloromethane, anhydrous NEt₃ (48 uL, 0.34 mmol) was added. The reaction mixture was heated to reflux overnight under N₂ atmosphere. The crude product was filtered through celite to remove the insoluble.

The filtrate was collected and extracted with water and dichloromethane. Solvents were removed at reduced pressure. Subsequent column chromatography with hexane or dichloromethane/ethyl acetate (4:1) yielded the product as a yellow solid. Yield: 32.2%. $^1$H NMR (400 MHz, CDCl$_3$): δ 8.19 (s, 1H), 8.06 (s, 1H), 7.52 (dd, 1H, J=2.0 Hz and 8.5 Hz), 7.46 (dd, 1H, J=2.5 Hz and 8.8 Hz), 7.37 (d, 1H, J=2.5 Hz), 7.33 (d, 1H, J=2.5 Hz), 7.24-7.30 (m, 2H), 7.12 (d, 1H, J=8.5 Hz), 6.78 (d, 1H, J=8.5 Hz), 6.66 (d, 2H, J=8.5 Hz), 6.62 (d, 2H, J=8.5 Hz), 4.92 (d, 1H, J=11.0 Hz), 4.14 (d, 1H, J=12.5 Hz), 3.71-3.74 (m, 13H), 3.46 (d, 1H, J=12.5 Hz), 1.17 (s, 3H), 0.83 (s, 3H); $^{13}$C{$^1$H} NMR (100 MHz, CDCl$_3$): δ 168.8, 167.4, 164.3, 159.2, 157.9, 157.8, 142.0, 138.3, 136.0, 135.6, 129.0, 128.7, 127.1, 123.7, 122.6, 121.9, 120.5, 119.8, 118.1, 117.9, 104.4, 104.3, 76.6, 72.8, 56.1, 55.9, 37.6, 26.2, 24.6.

Example 230-Synthesis of Emitter 1034

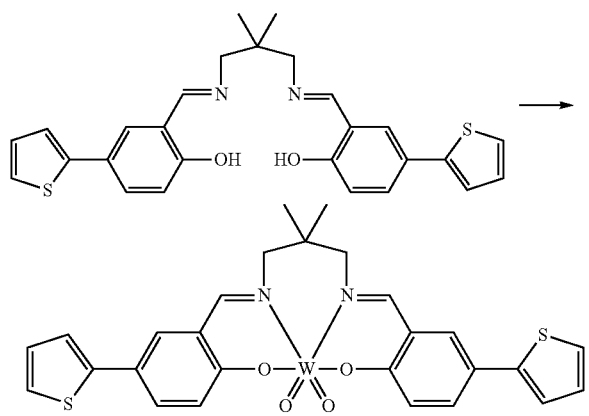

To a mixture of the ligand (80 mg, 0.17 mmol) and WO$_2$(dme)Cl$_2$ (64 mg, 0.17 mmol) suspended in 20 mL anhydrous dichloromethane, anhydrous NEt$_3$ (47 uL, 0.34 mmol) was added. The reaction mixture was heated to reflux overnight under N$_2$ atmosphere. The crude product was filtered through celite to remove the insoluble. The filtrate was collected and extracted with water and dichloromethane. Solvents were removed at reduced pressure. Subsequent column chromatography with hexane or dichloromethane/ethyl acetate (4:1) yielded the product as an orange solid.

Yield: 55.1%. $^1$H NMR (400 MHz, CDCl$_3$): δ 8.25 (s, 1H), 8.11 (s, 1H), 7.81 (dd, 1H, J=8.6 Hz and 2.2 Hz), 7.66 (dd, 1H, J=8.8 Hz and 2.2 Hz), 7.62 (d, 1H, J=2.0 Hz), 7.52 (d, 1H, J=2.2 Hz), 7.26-7.28 (m, 2H), 7.20 (d, 1H, J=5.0 Hz), 7.15 (d, 1H, J=8.6 Hz), 7.12 (d, 1H, J=3.4 Hz), 7.09 (t, 1H, J=4.4 Hz), 7.03 (t, 1H, J=4.5 Hz), 6.67 (d, 1H, J=8.9 Hz), 4.92 (d, 1H, J=11.1 Hz), 4.44 (d, 1H, J=12.4 Hz), 3.77 (d, 1H, J=11.2 Hz), 3.43 (d, 1H, J=12.6 Hz), 1.18 (s, 3H), 0.79 (s, 3H).

Example 231-Synthesis of Emitter 1035

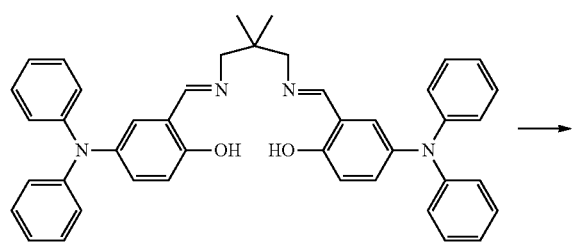

-continued

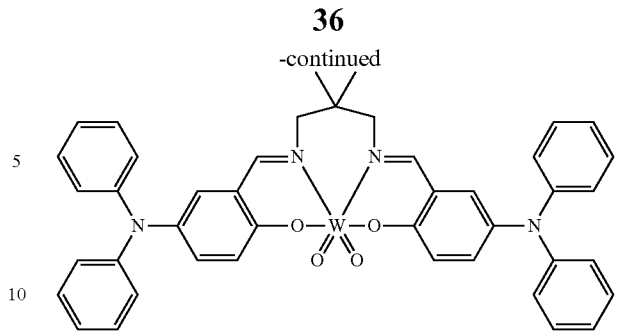

To a mixture of the ligand (80 mg, 0.12 mmol) and WO$_2$(dme)Cl$_2$ (50 mg, 0.13 mmol) suspended in 10 mL anhydrous tetrahydrofuran, anhydrous NEt$_3$ (35 uL, 0.25 mmol) was added. The reaction mixture was heated to reflux overnight under N$_2$ atmosphere. The crude product was filtered through celite to remove the insoluble. The filtrate was collected and extracted with water and dichloromethane. Solvents were removed at reduced pressure. Subsequent column chromatography with hexane or dichloromethane/ethyl acetate (4:1) yielded the product as a reddish orange solid.

Yield: 25.2%. $^1$H NMR (500 MHz, CDCl$_3$): δ 8.02 (s, 1H), 7.90 (s, 1H), 7.34 (t, 1H, J=3.0 Hz), 7.33 (t, 1H J=2.5 Hz), 7.20-7.27 (m, 8H), 7.12 (d, 1H, J=3.0 Hz), 7.07 (s, 2H), 7.02-7.05 (m, 8H), 7.00 (s, 1H), 6.97 (t, 3H, J=7.5 Hz), 6.69 (d, 1H, J=9.0 Hz), 4.87 (d, 1H, J=11.5 Hz), 4.21 (d, 1H, J=12.5 Hz), 3.65 (d, 1H, J=11.0 Hz), 3.37 (d, 1H, J=12.5 Hz), 1.12 (s, 3H), 0.77 (s, 3H); $^{13}$C{$^1$H}NMR (150 MHz, CDCl$_3$): δ 168.0, 165.4, 163.6, 156.5, 147.6, 147.6, 141.2, 138.4, 137.4, 132.3, 129.3, 129.3, 128.7, 128.2, 123.5, 123.4, 123.2, 122.6, 122.3, 122.3, 121.6, 76.6, 72.8, 37.63, 26.0, 24.0.

Example 232-Synthesis of Emitter 1036

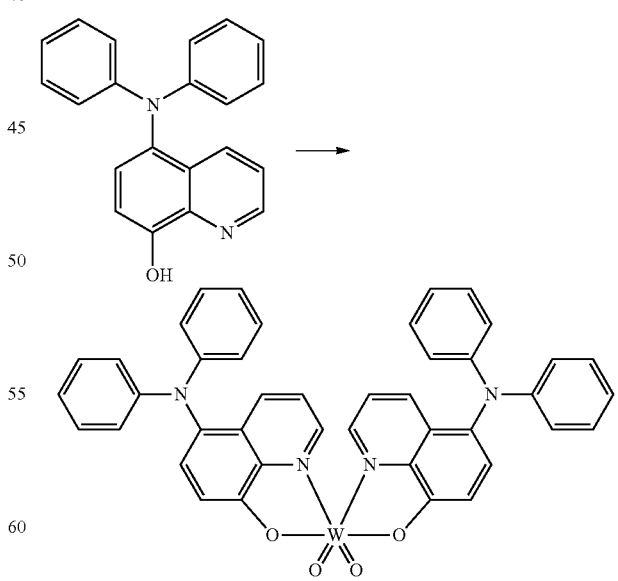

To a mixture of the ligand (70 mg, 0.22 mmol) and WO$_2$(dme)Cl$_2$ (43 mg, 0.11 mmol) suspended in 10 mL anhydrous dichloromethane, anhydrous NEt$_3$ (40 uL, 0.29 mmol) was added. The reaction mixture was heated to reflux overnight under $N_2$ atmosphere. The crude product was filtered through celite to remove the insoluble. The filtrate was collected and extracted with water and dichloromethane. Solvents were removed at reduced pressure. Subsequent column chromatography with hexane or dichloromethane/ethyl acetate (4:1) yielded the product as a yellow solid. Yield: 35.4%. $^1$H NMR (500 MHz, CDCl$_3$): δ 8.71 (dd, 1H, J=4.8 Hz and 1.3 Hz), 8.28 (dd, 1H, J=8.8 Hz and 1 Hz), 7.47 (d, 1H, J=8 Hz), 7.37 (d, 1H, J=8 Hz), 7.34 (dd, 1H, J=8.8 Hz and 4.8 Hz); 7.20 (t, 4H, J=7.5 Hz), 6.95-6.97 (m, 6H); $^{13}$C{$^1$H} NMR (150 MHz, CDCl$_3$): δ 157.0, 148.1, 147.3, 140.8, 136.8, 135.8, 130.1, 129.4, 127.5, 122.6, 122.4, 122.1, 116.1.

Example 233-Crystal and Structure Determination Data of Emitter 1031 and 1034

| Emitter | 1031 | 1034 |
|---|---|---|
| Empirical formula | C$_{27}$H$_{38}$N$_4$O$_4$W•3(CHCl$_3$) | C$_{27}$H$_{24}$N$_2$O$_4$S$_2$W•CHCl$_3$ |
| Formula weight | 1024.57 | 807.82 |
| Temperature, K | 100 | 100 |
| Crystal system | triclinic | monoclinic |
| Space group | P1-bar | P2$_1$/c |
| a, Å | 11.3171 (6), | 13.7715 (8) |
| b, Å | 12.4232 (7) | 18.7413 (10), |
| c, Å | 17.3681 (10) | 11.5039 (6) |
| α, ° | 108.237 (2) | 90.00 |
| β, ° | 92.779 (2), | 105.041 (2) |
| γ, ° | 116.686 (1) | 90.00 |
| V, Å$^3$ | 2020.1 (2) | 2867.4 (3) |
| Z | 2 | 4 |
| D$_c$, g cm$^{-3}$ | 1.684 | 1.871 |
| μ, mm$^{-1}$ | 3.49 | 4.49 |
| F(000) | 1016.0 | 1584.0 |
| No. of reflections | 49408 | 26997 |
| No. of independent reflections | 7456 | 5063 |
| GoF | 1.105 | 1.05 |
| R$_{int}$ | 0.063 | 0.030 |
| R$_1$[a], wR$_2$[b] (I > 2(I)) | 0.040, 0.088 | 0.026, 0.062 |

[a]R$_1$ = Σ||F$_o$| − |F$_c$||/Σ|F$_o$|.
[b]wR$_2$ = [Σw(|Fo$^2$| − |F$_c^2$|)$^2$/Σw|Fo$^2$|$^2$]$^{1/2}$.
[c]GoF = [Σw(|F$_o$| − |F$_c$|)$^2$/(N$_{obs}$ − N$_{param}$)]$^{1/2}$

Example 234-Selected Bond Lengths (Å) and Bond Angles (°) of Emitter 1031 and 1034

| Bond Length (Å) | 1031 | Bond Length (Å) | 1034 |
|---|---|---|---|
| W(1)—O(1) | 1.941 (3) | W(1)—O(1) | 1.933 (3) |
| W(1)—O(2) | 2.091 (3) | W(1)—O(2) | 2.069 (3) |
| W(1)—O(3) | 1.735 (4) | W(1)—O(3) | 1.731 (3) |
| W(1)—O(4) | 1.740 (3) | W(1)—O(4) | 1.728 (3) |
| W(1)—N(1) | 2.280 (4) | W(1)—N(1) | 2.310 (3) |
| W(1)—N(3) | 2.111 (4) | W(1)—N(2) | 2.146 (3) |

Example 235-Selected Bond Lengths (Å) and Bond Angles (°) of Emitter 1031 and 1034

| Bond Angle (°) | 1031 | 1034 |
|---|---|---|
| O(1)—W(1)—O(2) | 86.76 (14) | 88.52 (12) |
| O(3)—W(1)—O(4) | 104.11 (17) | 103.47 (14) |
| N(1)—W(1)—N(2) | | 76.72 (12) |
| N3—W1—N1 | 78.28 (16) | |
| O(1)—W(1)—O(3) | 98.54 (16) | 98.01 (13) |
| O(1)—W(1)—O(4) | 100.41 (16) | 104.34 (13) |
| O(2)—W(1)—O(3) | 164.23 (16) | 164.08 (13) |
| O(2)—W(1)—O(4) | 89.40 (15) | 88.81 (13) |
| O(1)—W(1)—N(1) | 82.53 (15) | 80.80 (12) |
| O(1)—W(1)—N(2) | | 155.96 (12) |
| O(2)—W(1)—N(1) | 79.10 (14) | 80.36 (11) |
| O(2)—W(1)—N(2) | | 79.46 (12) |
| O(3)—W(1)—N(3) | 89.96 (17) | |
| O(4)—W(1)—N(3) | 96.51 (17) | |
| O(1)—W(1)—N(3) | 158.54 (16) | |
| N(1)—W(1)—O(3) | 86.83 (16) | 86.34 (13) |
| O(2)—W(1)—N(3) | 80.30 (15) | |
| N(1)—W(1)—O(4) | 167.99 (16) | 167.95 (13) |
| N(2)—W(1)—O(3) | | 89.04 (14) |
| N(2)—W(1)—O(4) | | 96.22 (13) |

Example 236-Photophysical Data

| Emitter | Medium (T/K) | λ$_{abs}$ [nm] (ε [mol$^{-1}$ dm$^3$ cm$^{-1}$])[a] | λ$_{max}$/nm (τ/μs) | Φ$_{sol}$[a,b] | Φ$_{film}$[d] |
|---|---|---|---|---|---|
| 1029 | DCM (298) | 270 (26200), 299 (18200), 402 (5500) | 599 (83.6) | 0.030 | |
| | Thin film (298) | | | | |
| | 5% in MCP | | 580 | | 0.22 |
| | 5% in PMMA | | 579 | | 0.08 |
| 1030 | DCM (298) | 250 (45200), 331 (20400), 387 (7200), 422 (7900) | 559 (89.5) | 0.052 | |
| | Thin film (298) | | | | |
| | 5% in MCP | | 540(sh), 577 | | 0.25 |
| | 5% in PMMA | | 573 | | 0.07 |
| 1031 | DCM (298) | 346 (10300), 424 (30200) | 547 (13.8) | 0.029 | |
| | Thin film (298) | | | | |
| | 5% in MCP | | 536 | | 0.19 |
| | 5% in PMMA | | 534 | | 0.05 |

-continued

| Emitter | Medium (T/K) | $\lambda_{abs}$ [nm] ($\epsilon$ [mol$^{-1}$ dm$^3$ cm$^{-1}$])[a] | $\lambda_{max}$/nm ($\tau$/μs) | $\Phi_{sol}$[a,b] | $\Phi_{film}$[d] |
|---|---|---|---|---|---|
| 1032 | DCM (298) | 250 (47400), 302 (15200), 415 (3700) | 615 (79.0) | 0.065 | |
| | Thin film (298) | | | | |
| | 5% in MCP | | 602 | | 0.21 |
| | 5% in PMMA | | 599 | | 0.13 |
| 1033 | DCM (298) | 265 (42400), 418 (3000) | 605 (13.2) | 0.003 | |
| | Thin film (298) | | | | |
| | 5% in MCP | | 615 | | 0.12 |
| | 5% in PMMA | | 616 | | 0.06 |
| 1034 | DCM (298) | 284 (54600), 446 (4100) | 602, 662(sh) (5.4) | 0.002 | |
| | Thin film (298) | | | | |
| | 5% in PMMA | | 653 | | 0.03 |
| 1035 | DCM (298) | 295 (47700), 479 (2300) | 630 (1.0) | 0.002 | |
| 1036 | DCM (298) | 289 (41400), 345(sh, 6800), 450 (5800) | 629 (0.6) | 0.001 | |
| | Thin film (298) | | | | |
| | 5% in PMMA | | 622 | | 0.02 |

Example 237-Electrochemical Data for the Emitters[a]

| Complex[b] | $E_{pa}$/V[c] | $E_{pc}$/V[c] | HOMO/eV[d] | LUMO/eV[e] |
|---|---|---|---|---|
| 1029 | +1.38 | −1.77 | −6.13 | −2.98 |
| 1030 | +1.22 | −1.91 | −5.97 | −2.84 |
| 1031 | +0.68, +0.81, +1.04 | −2.24 | −5.43 | −2.51 |
| 1034 | +1.00 | −1.68 | −5.75 | −3.07 |
| 1036 | +0.74[f], +1.27 | −1.78 | −5.49 | −2.97 |

[a]Scan rate = 100 mVs$^{-1}$.
[b]Cyclic voltammogram was recorded in degassed CH$_2$Cl$_2$.
[c]Versus ferrocene/ferrocenium couples. $E_{pa}$ and $E_{pc}$ were the peak anodic and peak cathodic potentials, respectively.
[d]Estimated from the oxidation potentials. $E_{HOMO}$ = −e (4.75 V + $E_{pa}$).
[e]Estimated from the reduction potentials. $E_{LUMO}$ = −e (4.75 V + $E_{pc}$).
[f]$E_{1/2}$ of quasi-reversible wave [$E_{1/2}$ = ($E_{pc}$ + $E_{pa}$)/2]

With respect to any figure or numerical range for a given characteristic, a figure or a parameter from one range may be combined with another figure or a parameter from a different range for the same characteristic to generate a numerical range.

Other than in the operating examples, or where otherwise indicated, all numbers, values and/or expressions referring to quantities of ingredients, reaction conditions, etc., used in the specification and claims are to be understood as modified in all instances by the term "about."

It should be understood that the examples and embodiments described herein are for illustrative purposes only and that various modifications or changes in light thereof will be suggested to persons skilled in the art and are to be included within the spirit and purview of this application.

What is claimed is:

1. An OLED emitter comprising at least one selected from Emitter 1002-Emitter 1011, Emitter 1013-Emitter 1021, and Emitter 1023-Emitter 1028:

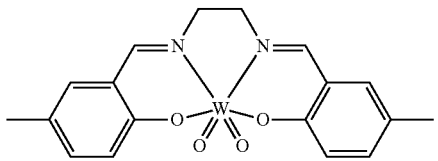

Emitter 1002

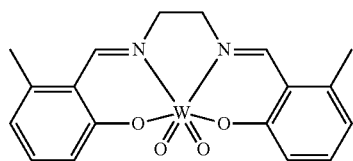

Emitter 1003

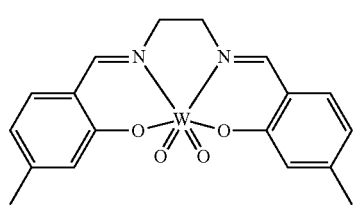

Emitter 1004

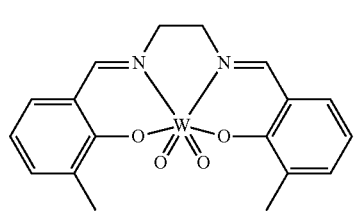

Emitter 1005

Emitter 1006
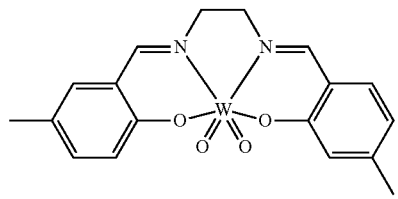
Emitter 1007
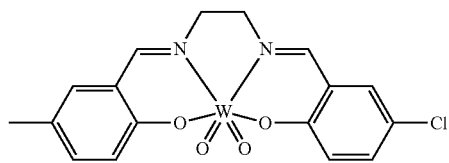
Emitter 1008
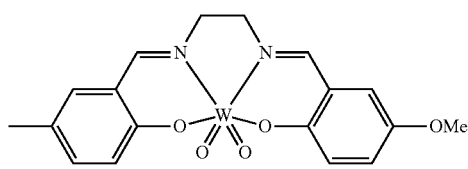
Emitter 1009
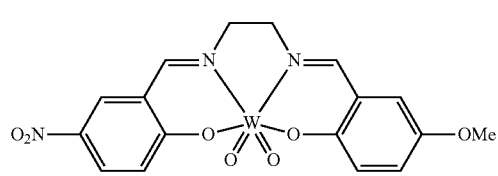
Emitter 1010
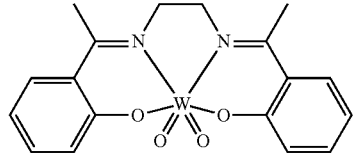
Emitter 1011
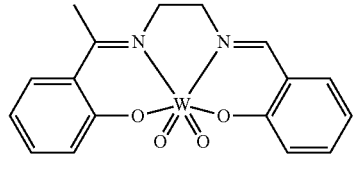
Emitter 1013
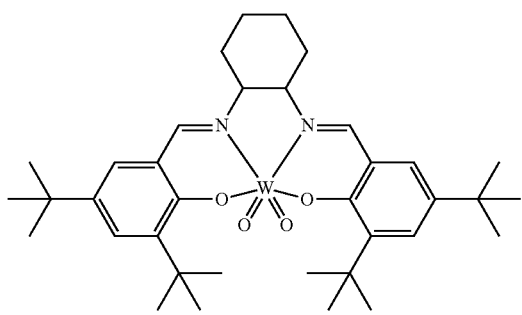
Emitter 1014
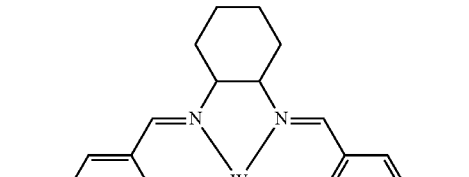
Emitter 1015
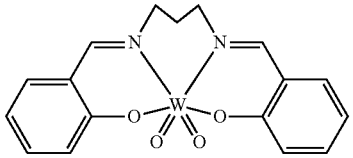
Emitter 1016
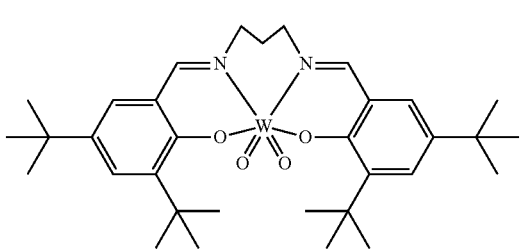
Emitter 1017
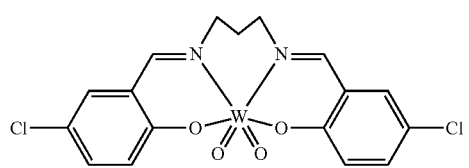
Emitter 1018
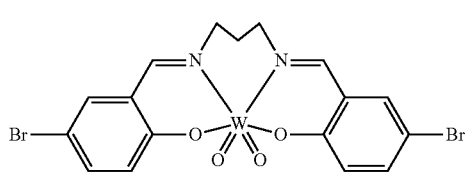
Emitter 1019
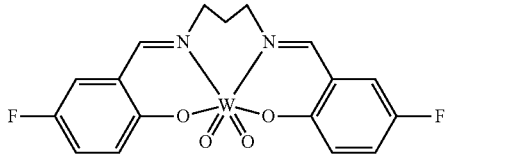
Emitter 1020
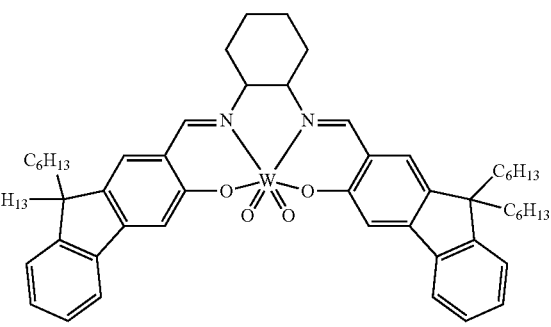

Emitter 1021
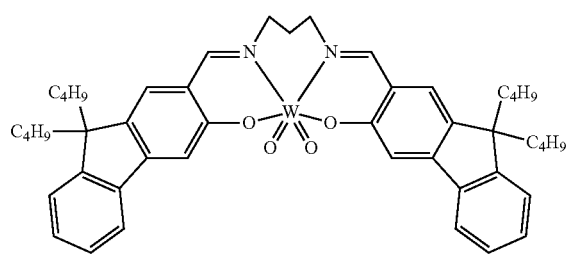

Emitter 1023
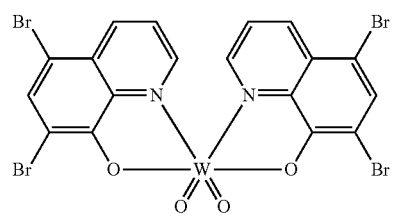

Emitter 1024
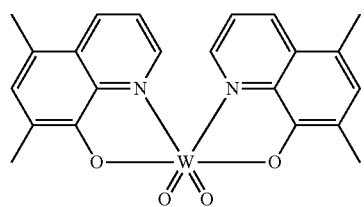

Emitter 1025
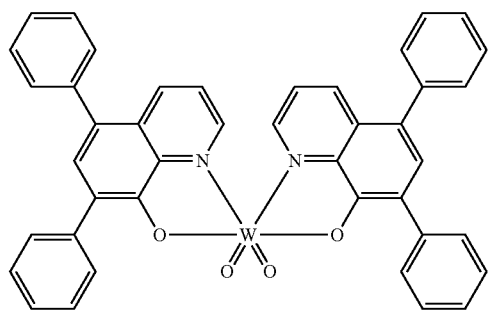

Emitter 1026
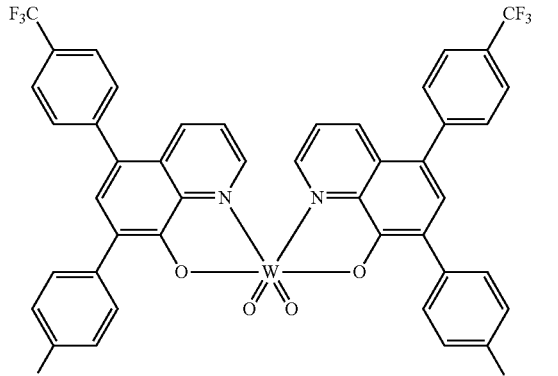

Emitter 1027
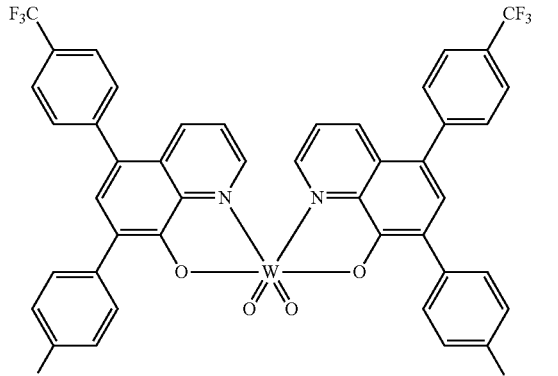

Emitter 1028
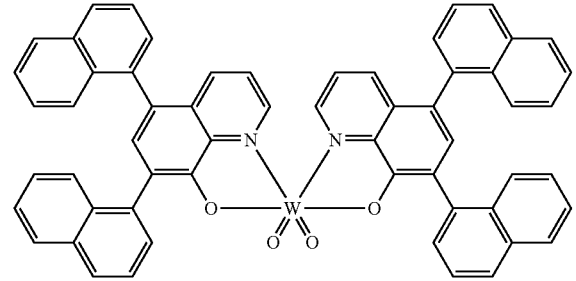

2. A light-emitting device comprising at least one OLED emitter(s) in claim 1 as an emitting material(s).

3. The light-emitting device of claim 2, wherein the device is an organic light-emitting diode; and/or
wherein the device is fabricated by vacuum deposition; and/or
wherein the device is fabricated by a solution processes; and/or
wherein a dopant concentration is greater than 5 wt. %; and/or
wherein the device contains one emissive layer; and/or
wherein the device contains more than one emissive layer(s).

4. An OLED emitter comprising at least one selected from emitters 1029-1036:

1029
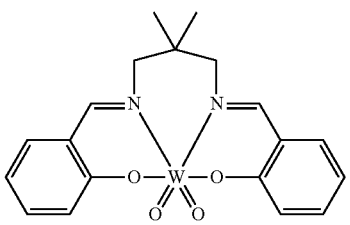

1030
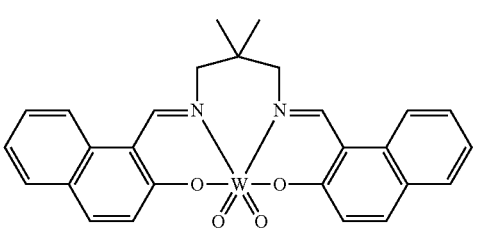

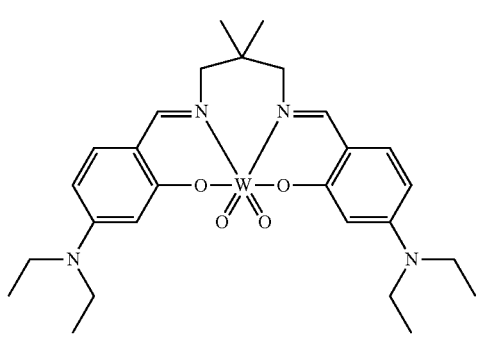
1031

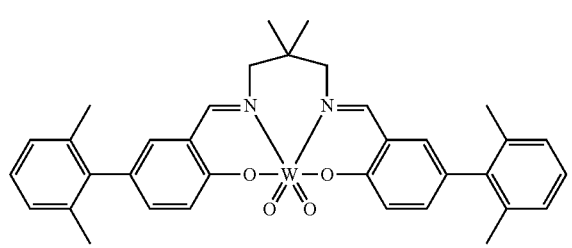
1032

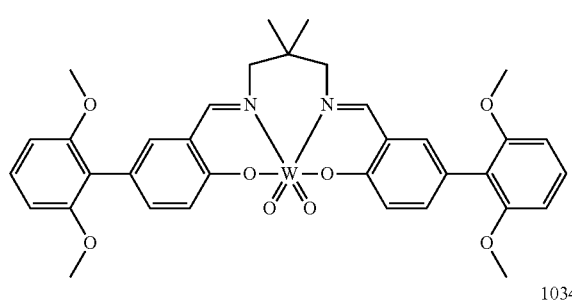
1033

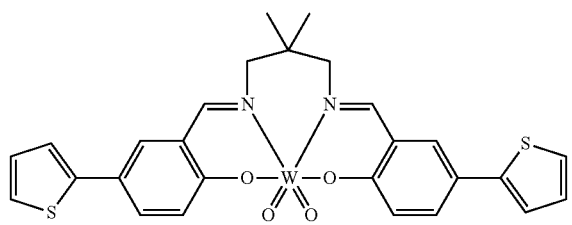
1034

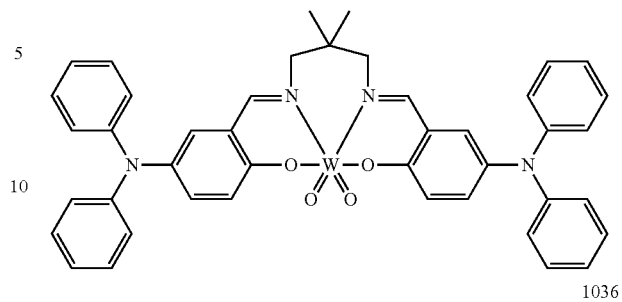
1035

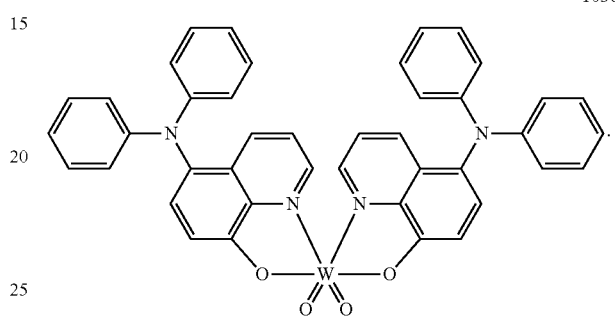
1036

5. A light-emitting device comprising at least one OLED emitter(s) in claim 4 as an emitting material(s).

6. The light-emitting device of claim 5, wherein the device is an organic light-emitting diode; and/or wherein the device is fabricated by vacuum deposition; and/or wherein the device is fabricated by a solution processes; and/or wherein a dopant concentration is greater than 5 wt. %; and/or wherein the device contains one emissive layer; and/or wherein the device contains more than one emissive layer(s).

* * * * *